(12) United States Patent
Wu et al.

(10) Patent No.: US 9,276,556 B1
(45) Date of Patent: Mar. 1, 2016

(54) MICROMECHANICAL DEVICES BASED ON PIEZOELECTRIC RESONATORS

(71) Applicants: I-Tsang Wu, Tampa, FL (US); Julio Mario Dewdney, Greensboro, NC (US); Jing Wang, Tampa, FL (US)

(72) Inventors: I-Tsang Wu, Tampa, FL (US); Julio Mario Dewdney, Greensboro, NC (US); Jing Wang, Tampa, FL (US)

(73) Assignee: University of South Florida, Tampa, FL (US)

( * ) Notice: Subject to any disclaimer, the term of this patent is extended or adjusted under 35 U.S.C. 154(b) by 57 days.

(21) Appl. No.: 14/032,871

(22) Filed: Sep. 20, 2013

Related U.S. Application Data

(60) Provisional application No. 61/703,547, filed on Sep. 20, 2012, provisional application No. 61/711,856, filed on Oct. 10, 2012, provisional application No. 61/711,866, filed on Oct. 10, 2012.

(51) Int. Cl.
| | |
|---|---|
| *H03H 9/54* | (2006.01) |
| *H03H 9/46* | (2006.01) |
| *H03H 9/205* | (2006.01) |
| *H03H 9/50* | (2006.01) |
| *H03H 9/15* | (2006.01) |

(52) U.S. Cl.
CPC .............. *H03H 9/462* (2013.01); *H03H 9/205* (2013.01); *H03H 9/505* (2013.01); *H03H 2009/155* (2013.01)

(58) Field of Classification Search
CPC . H03H 3/0077; H03H 3/04; H03H 2003/027; H03H 2003/0414; H03H 2009/02291; H03H 2009/02322; H03H 2009/155; H03H 2009/241; H03H 9/02259; H03H 9/02393; H03H 9/02409; H03H 9/02417; H03H 9/02425; H03H 9/205; H03H 9/2405; H03H 9/2436; H03H 9/2447; H03H 9/2452; H03H 9/462; H03H 9/467; H03H 9/485; H03H 9/505; H03H 9/525; H01L 41/081; B81B 2203/01; B81B 2207/05; B81B 2207/053
USPC .................................................. 333/186, 188
See application file for complete search history.

(56) References Cited

U.S. PATENT DOCUMENTS

| | | | | |
|---|---|---|---|---|
| 6,909,221 | B2 * | 6/2005 | Ayazi et al. ................... | 310/321 |
| 7,750,759 | B1 * | 7/2010 | Lee et al. ...................... | 333/186 |
| 8,324,986 | B2 * | 12/2012 | Lutz et al. ..................... | 333/186 |
| 2008/0079515 | A1 * | 4/2008 | Ayazi et al. ................... | 333/187 |
| 2009/0322448 | A1 * | 12/2009 | Bhave et al. ................... | 333/186 |
| 2010/0066467 | A1 * | 3/2010 | Ayazi et al. ................... | 333/187 |
| 2010/0171570 | A1 * | 7/2010 | Chandrahalim et al. ....... | 333/186 |
| 2012/0038431 | A1 * | 2/2012 | Jaakkola et al. .............. | 331/155 |

OTHER PUBLICATIONS

Stephanou et al.; "Mechanically Coupled Contour Mode Piezoelectric Aluminum Nitride MEMS Filters"; IEEE MEMS 2006, Istanbul, Turkey, Jan. 22-26, 2006, pp. 906-909.*

Yan et al.; "Single-Chip Mulitple-Frrequency VHF Low-Impedance Micro Piezoelectric Resoantors"; IEEE Electron Device Letters, vol. 27, No. 4, Apr. 2006, pp. 246-248.*

(Continued)

*Primary Examiner* — Barbara Summons
(74) *Attorney, Agent, or Firm* — Thomas | Horstemeyer, LLP

(57) ABSTRACT

In some embodiments, a micromechanical filter includes multiple subfilters, each subfilter comprising multiple piezoelectric resonators mechanically coupled in series, wherein the subfilters are mechanically coupled to each other in parallel.

19 Claims, 14 Drawing Sheets

(56) References Cited

OTHER PUBLICATIONS

Ho et al.; "Piezoelectric-on-Silicon Lateral Bulk Acoustic Wave Micromechanical Resonators"; IEEE Journal of Microelectromechanical Systems, vol. 17, No. 2, Apr. 2008, pp. 512-520.*

Demirci et al.; "A Low Impedance VHF Micromechanical Filter Using Coupled-Array Composite Resonators"; Transducers '05, IEEE the 13th International Conference on Solid-State Sensors, Actuators and Microsystems, Seoul, Korea, Jun. 5-9, 2005, pp. 2131-2134.*

Li et al.; "A Micromechanical Parallel-Class Disk-Array Filter"; IEEE International Frequency Control Symposium, 2007 Joint with the 21st European Frequency Time Forum; May 29-Jun. 1, 2007, pp. 1356-1361 and one page IEEE Xplore abstract.*

Akgul et al.; "Voltage-Controlled Tuning to Optimize MEMS Resonator Array-Composite Output Power"; 2011 Joint Conference of the IEEE International Frequency Control Symposium (FCS) and the European Frequency and Time Forum, May 2-5, 2011, pp. 1-6 and one page IEEE Xplore abstract.*

Matsumura et al.; "Selective Mode Excitation of Piezoelectric Disk-type Resonator by Electrode Pattern Definition"; 2010 IEEE International Ultrasonics Symposium (IUS) Proceedings; Oct. 11-14, 2010, pp. 979-982 and one page IEEE Xplore abstract.*

Clark et al.; "Parallel-Coupled Square-Resonator Micromechanical Filter Arrays"; 2006 IEEE International Frequency Control Symposium and Exposition, Jun. 2006, pp. 485-490 and one page IEEE Xplore abstract.*

Piazza et al.; "Aluminum Nitride Contour-Mode Vibrating RF MEMS"; 2006 IEEE MTT-S International Microwave Symposium Digest, Jun. 11-16, 2006, pp. 664-667 and one page IEEE Xplore abstract.*

Zuo et al.; "Channel Select RF MEMS Filters Based on Self-Coupled AlN Contour Mode Piezoelectric Resonators"; 2007 IEEE Ultrasonics Symposium, Oct. 28-31, 2007, pp. 1156-1159 and one page IEEE Xplore abstract.*

Nathanson, Harvey C., et al. "The resonant gate transistor." Electron Devices, IEEE Transactions on 14.3 (1967): 117-133, Mar. 1967.

Brandolini, Massimo, et al. "Toward multistandard mobile terminals—fully integrated receivers requirements and architectures." Microwave Theory and Techniques, IEEE Transactions on 53.3 (2005): 1026-1038, Mar. 2005.

Jakonis, Darius, et al. "A 2.4-GHz RF sampling receiver front-end in 0.18-µm CMOS." Solid-State Circuits, IEEE Journal of 40.6 (2005): 1265-1277.

Magoon, Rahul, et al. "A single-chip quad-band (850/900/1800/1900 MHz) direct conversion GSM/GPRS RF transceiver with integrated VCOs and fractional-N synthesizer." Solid-State Circuits, IEEE Journal of 37.12 (2002): 1710-1720, Dec. 2002.

"Rf MEMS switches are reliable: a comprehensive technology overview." (2010) retrieved Apr. 4, 2012, from: http://www.memsjournal.com/2010/07/rf-mems-switches-are-reliable-a-comprehensive-technology-overview.html.

"SiTime Ships 20 Million Units of MEMS First™ CMOS Oscillators and Clock Generators". (2010) Retrieved Apr. 4, 2012, from http://sitime.com/news.

Howe, Roger T., and Richard S. Muller. "Resonant-microbridge vapor sensor." Electron Devices, IEEE Transactions on 33.4 (1986): 499-596, Apr. 1986.

Tang, William C., Tu-Cuong H. Nguyen, and Roger T. Howe. "Laterally driven polysilicon resonant microstructures." Micro Electro Mechanical Systems, 1989, Proceedings, An Investigation of Micro Structures, Sensors, Actuators, Machines and Robots. IEEE, (1989): 53-59.

Nguyen, C. T. C., and R. T. Howe. "Polysilicon microresonators for signal processing." Digest of Papers, Government Microcircuit and Applications Conference, San Diego, CA (1994): 195-198, Aug. 1994.

Wang, Kun, and Clark TC Nguyen. "High-order medium frequency micromechanical electronic filters." Microelectromechanical Systems, Journal of 8.4 (1999): 534-556, Dec. 1999.

Wang, Kun, Ark-Chew Wong, and Clark TC Nguyen. "VHF free-free beam high-Q micromechanical resonators." Microelectromechanical Systems, Journal of 9.3 (2000): 347-360, Sep. 2000.

Wong, Ark-Chew, and Clark TC Nguyen. "Micromechanical mixer-filters ("mixlers")." Microelectromechanical Systems, Journal of 13.1 (2004): 100-112, Feb. 2004.

Clark, John R., Wan-Thai Hsu, and CT-C. Nguyen. "High-Q VHF micromechanical contour-mode disk resonators." Electron Devices Meeting, 2000. IEDM'00. Technical Digest. International. IEEE, 2000: 399-402.

Wang, Jing, Zeying Ren, and Clark TC Nguyen. "1.156-GHz self-aligned vibrating micromechanical disk resonator." Ultrasonics, Ferroelectrics and Frequency Control, IEEE Transactions on 51.12 (2004): 1607-1628, Dec. 2004.

Abdelmoneum, Mohamed, Mustafa U. Demirci, and Clark TC Nguyen. "Stemless wine-glass-mode disk micromechanical resonators." Micro Electro Mechanical Systems, 2003. MEMS-03 Kyoto. IEEE The Sixteenth Annual International Conference on. IEEE, 2003: 698-701, Jan. 2003.

Li, Sheng-Shian, et al. "Micromechanical "hollow-disk" ring resonators." Micro Electro Mechanical Systems, 2004. 17th IEEE International Conference on.(MEMS). IEEE, 2004: 821-824.

Demirci, Mustafa U., and Clark Tc Nguyen. "Mechanically corner-coupled square microresonator array for reduced series motional resistance." 12th Int. Conf. on Solid State Sensors & Actuators (Transducers '03), Jun. 2003, 955-958.

Hao, Zhili, Siavash Pourkamali, and Farrokh Ayazi. "VHF single-crystal silicon elliptic bulk-mode capacitive disk resonators—part I: design and modeling." Microelectromechanical Systems, Journal of 13.6 (2004): 1043-1053, Dec. 2004.

Pourkamali, Siavash, Zhili Hao, and Farrokh Ayazi. "VHF single crystal silicon capacitive elliptic bulk-mode disk resonators—part II: implementation and characterization." Microelectromechanical Systems, Journal of 13.6 (2004): 1054-1062, Dec. 2004.

Lin, Yu-Wei, et al. "Vibrating micromechanical resonators with solid dielectric capacitive transducer gaps." Frequency Control Symposium and Exposition, 2005. Proceedings of the 2005 IEEE International. IEEE, 2005: 128-134.

Weinstein, Dana, and Sunil Bhave. "Internal dielectric transduction in bulk-mode resonators." Microelectromechanical Systems, Journal of 18.6 (2009): 1401-1408, Dec. 2009.

Lakin, K. M., and J. S. Wang. "UHF composite bulk wave resonators." 1980 Ultrasonics Symposium. IEEE, 1980: 834-837.

Ruby, Richard, et al. "PCS 1900 MHz duplexer using thin film bulk acoustic resonators (FBARs)." Electronics Letters 35.10 (1999): 794-795.

Lakin, K. M., et al. "Stacked crystal filters implemented with thin films." Frequency Control, 1989., Proceedings of the 43rd Annual Symposium on. IEEE, 1989: 536-543.

Piazza, Gianluca, Philip J. Stephanou, and Albert P. Pisano. "One and two port piezoelectric higher order contour-mode MEMS resonators for mechanical signal processing." Solid-State Electronics 51.11 (2007): 1596-1608.

Stephanou, Philip J., et al. "Piezoelectric aluminum nitride MEMS annular dual contour mode filter." Sensors and Actuators A: Physical 134.1 (2007), available online Jun. 2006.

Piazza, Gianluca, Philip J. Stephanou, and Albert P. Pisano. "Single-chip multiple-frequency ALN MEMS filters based on contour-mode piezoelectric resonators." Microelectromechanical Systems, Journal of 16.2 (2007): 319-328, Apr. 2007.

Abdolvand, Reza, and Farrokh Ayazi. "High-frequency monolithic thin-film piezoelectric-on-substrate filters." International Journal of Microwave and Wireless Technologies 1.01 (2009): 29-35, available online Mar. 2009.

Abdolvand, Reza, et al. "Thin-film piezoelectric-on-silicon resonators for high-frequency reference oscillator applications." Ultrasonics, Ferroelectrics, and Frequency Control, IEEE Transactions on 55.12 (2008): 2596-2606, Dec. 2008.

(56) References Cited

OTHER PUBLICATIONS

Abdolvand, Reza. Thin-film piezoelectric-on-substrate resonators and narrowband filters. Ph.D. diss., Georgia Institute of Technology, ProQuest, 2008, 135 pages.
Olsson III, Roy H., et al. "Post-CMOS compatible aluminum nitride MEMS filters and resonant sensors." Frequency Control Symposium, 2007 Joint with the 21st European Frequency and Time Forum. IEEE International. IEEE, 2007: 412-419.
Piazza, Gianluca, Philip J. Stephanou, and Albert P. Pisano. "Piezoelectric aluminum nitride vibrating contour-mode MEMS resonators." Microelectromechanical Systems, Journal of 15.6 (2006): 1406-1418, Dec. 2006.
Frederico, S., et al. "Silicon sacrificial layer dry etching (SSLDE) for free-standing RF MEMS architectures." Micro Electro Mechanical Systems, 2003. MEMS-03 Kyoto. IEEE The Sixteenth Annual International Conference on. IEEE, 2003: 570-573.
Park, Sang-Hyun, et al. "Two-step deposition process of piezoelectric ZnO film and its application for film bulk acoustic resonators." Journal of Vacuum Science & Technology A 18.5 (2000): 2432-2436, Sep./Oct. 2000.
Molarius, J., et al. "Piezoelectric ZnO films by rf sputtering." Journal of Materials Science: Materials in Electronics 14.5-7 (2003): 431.
Piazza, Gianluca. Piezoelectric aluminum nitride vibrating RF MEMS for radio front-end technology. Diss. University of California, Berkeley, 2005.
Hao, Zhili, Ahmet Erbil, and Farrokh Ayazi. "An analytical model for support loss in micromachined beam resonators with in-plane flexural vibrations." Sensors and Actuators A: Physical 109.1 (2003): 156-164.
Wang, Jing. Self-aligned radial contour mode micromechanical disk resonators for wireless communications. Ph.D. diss., University of Michigan. ProQuest, 2006. (Part 1 of 8).
Wang, Jing. Self-aligned radial contour mode micromechanical disk resonators for wireless communications. Ph.D. diss., University of Michigan. ProQuest, 2006. (Part 2 of 8).
Wang, Jing. Self-aligned radial contour mode micromechanical disk resonators for wireless communications. Ph.D. diss., University of Michigan. ProQuest, 2006. (Part 3 of 8).
Wang, Jing. Self-aligned radial contour mode micromechanical disk resonators for wireless communications. Ph.D. diss., University of Michigan. ProQuest, 2006. (Part 4 of 8).
Wang, Jing. Self-aligned radial contour mode micromechanical disk resonators for wireless communications. Ph.D. diss., University of Michigan. ProQuest, 2006. (Part 5 of 8).
Wang, Jing. Self-aligned radial contour mode micromechanical disk resonators for wireless communications. Ph.D. diss., University of Michigan. ProQuest, 2006. (Part 6 of 8).
Wang, Jing. Self-aligned radial contour mode micromechanical disk resonators for wireless communications. Ph.D. diss., University of Michigan. ProQuest, 2006. (Part 7 of 8).
Wang, Jing. Self-aligned radial contour mode micromechanical disk resonators for wireless communications. Ph.D. diss., University of Michigan. ProQuest, 2006. (Part 8 of 8).
Abdolvand, Reza, et al. "Quality factor in trench-refilled polysilicon beam resonators." Microelectromechanical Systems, Journal of 15.3 (2006): 471-478, Jun. 2006.
Pang, Wei, et al. "Temperature-compensated film bulk acoustic resonator above 2 GHz." Electron Device Letters, IEEE 26.6 (2005): 369-371, Jun. 2005.
Yanagitani, Takahiko, et al. "P1J-1 Temperature Characteristics of Pure Shear Mode FBARs Consisting of (1120) Textured ZnO Films." Ultrasonics Symposium, 2006. IEEE. IEEE, 2006: 1459-1462.
Hsu, Wan-Thai, and CT-C. Nguyen. "Stiffness-compensated temperature-insensitive micromechanical resonators." Micro Electro Mechanical Systems, 2002. The Fifteenth IEEE International Conference on. IEEE, 2002: 731-734.
Samarao, Ashwin K., and Farrokh Ayazi. "Temperature compensation of silicon resonators via degenerate doping." Electron Devices, IEEE Transactions on 59.1 (2012): 87-93, Jan. 2012.
Pourkamali, Siavash, Gavin K. Ho, and Farrokh Ayazi. "Low-Impedance VHF and UHF Capacitive Silicon Bulk Acoustic-Wave Resonators—Part II: Measurement and Characterization." IEEE Transactions on Electron Devices 54.8 (2007): 2024-2030, Aug. 2007.
Clark, John R., et al. "High-Q UHF micromechanical radial-contour mode disk resonators." Microelectromechanical Systems, Journal of 14.6 (2005): 1298-1310, Dec. 2005.
Chong, Kyuchul, et al. "Three-dimensional substrate impedance engineering based on p-/p+ Si substrate for mixed-signal signal system-on-chip (SoC)." Electron Devices, IEEE Transactions on 52.11 (2005): 2440-2446, Nov. 2005.
Pourkamali, Siavash, Reza Abdolvand, and Farrokh Ayazi. "A 600 kHz electrically-coupled MEMS bandpass filter." Micro Electro Mechanical Systems, 2003. MEMS-03 Kyoto. IEEE The Sixteenth Annual International Conference on. IEEE, 2003: 702-705.
Pourkamali, Siavash, and Farrokh Ayazi. "Electrically coupled MEMS bandpass filters: Part I: With coupling element." Sensors and Actuators A: Physical 122.2 (2005): 307-316, available online May 3, 2005.
Lakin, K. M. "Fundamental properties of thin film resonators." Frequency Control, 1991., Proceedings of the 45th Annual Symposium on. IEEE, 1991: 201-206.
Li, Sheng-Shian, et al. "An MSI micromechanical differential disk-array filter." Solid-State Sensors, Actuators and Microsystems Conference, 2007. Transducers 2007. International. IEEE, 2007: 307-311, Jun. 10-14, 2007.
Stefanou, Stefanos, et al. "Ultra Low silicon substrate noise crosstalk using metal Faraday cages in a silicon-on-insulator insulator technology." IEEE transactions on electron devices (2003): 486-491.
"Theory of Intermodulation Distoration Measurement", Application Note 5C-043, Maury Microwave Corporation, Jul. 1999, retrieved Apr. 4, 2012, from: http://www.maurymw.com/support/pdfs/5C-043.pdf, 3 pages.
Zuo, Chengjie. "AlN MEMs and CMOS IC co-design for multi-frequency reconfigurable wireless communications." Ph.D. diss. University of Pennsylvania, (2010). (Part 1 of 6).
Zuo, Chengjie. "AlN MEMs and CMOS IC co-design for multi-frequency reconfigurable wireless communications." Ph.D. diss. University of Pennsylvania, (2010). (Part 2 of 6).
Zuo, Chengjie. "AlN MEMs and CMOS IC co-design for multi-frequency reconfigurable wireless communications." Ph.D. diss. University of Pennsylvania, (2010). (Part 3 of 6).
Zuo, Chengjie. "AlN MEMs and CMOS IC co-design for multi-frequency reconfigurable wireless communications." Ph.D. diss. University of Pennsylvania, (2010). (Part 4 of 6).
Zuo, Chengjie. "AlN MEMs and CMOS IC co-design for multi-frequency reconfigurable wireless communications." Ph.D. diss. University of Pennsylvania, (2010). (Part 5 of 6).
Zuo, Chengjie. "AlN MEMs and CMOS IC co-design for multi-frequency reconfigurable wireless communications." Ph.D. diss. University of Pennsylvania, (2010). (Part 6 of 6).
Navid, Reza, et al. "Third-order intermodulation distortion in capacitively-driven CC-beam micromechanical resonators." Micro Electro Mechanical Systems, 2001. MEMS 2001. The 14th IEEE International Conference on. IEEE, 2001: 228-231, Jan. 21-25, 2001.
Alastalo, Ari T., and Ville Kaajakari. "Intermodulation in capacitively coupled microelectromechanical filters." IEEE electron device letters 26.5 (2005): 289-291, May 2005.
Lin, Yu-Wei, et al. "Third-order intermodulation distortion in capacitively-driven VHF micromechanical resonators." Proc. IEEE Int. Ultrasonics Symposium, No. 2, Rotterdam, Netherlands. 2005: 1592-1595.
Zhu, Xiangwei, et al. "A novel definition and measurement method of group delay and its application." Instrumentation and Measurement, IEEE Transactions on 58.1 (2009): 229-233.
"Agilent PNA Microwave Network Analyzers", Application Note 1408-2, Agilent Technologies, Jan. 28, 2004, retrieved Jun. 4, 2012 from: http://cp.literature.agilent.com/litweb/pdf/5988-9619EN.pdf.
Ruby, Rich. "A decade of FBAR success and what is needed for another successful decade." Piezoelectricity, Acoustic Waves and Device Applications (SPAWDA), 2011 Symposium on. IEEE, 2011: 365-369.

\* cited by examiner

MICROMECHANICAL DEVICES BASED ON PIEZOELECTRIC RESONATORS

CROSS-REFERENCE TO RELATED APPLICATION(S)

This application claims priority to U.S. Provisional Application Ser. Nos. 61/703,547, filed Sep. 20, 2012, 61/711,856, filed Oct. 10, 2012, and 61/711,866, filed Oct. 10, 2012, which are each hereby incorporated by reference herein in their entireties.

NOTICE OF GOVERNMENT-SPONSORED RESEARCH

This invention was made with Government support under grant/contract numbers 2106112000 and 0925929, awarded by the National Science Foundation (NSF). The Government has certain rights in the invention.

BACKGROUND

Wireless communications enable a wide variety of applications, such as satellite transmission, radio and television broadcasting, sensor networks, global positioning system (GPS), and mobile communications. Emerging technologies have led to a new generation of multifunctional, small-size, and low-cost communications devices that cover a wide variety of wireless communications applications.

As the demand for multifunctional wireless communications devices increases, so does the demand for smaller, low-cost, and single-chip oscillators, mixers, and radio frequency (RF) front-end and intermediate frequency (IF) filters that can bring together in a single device multiple wireless standards operating at different frequencies, without compromising size, portability, and cost. Currently, the majority of the modern transceiver systems are based on heterodyne architectures, which utilize a number of discrete resonant components such as quartz crystals, surface acoustic wave (SAW) devices, and thin film bulk acoustic resonator (FBAR) devices to implement oscillators with high quality factors (Qs) for frequency reference and band-pass filtering.

Despite the beneficial high Qs offered by quartz crystal and SAW devices, and the low motional resistance provided by FBARs, they are relatively bulky off-chip components that must be integrated with electronics at the board level, thus hindering the ultimate miniaturization and portability of wireless transceivers. It can therefore be appreciated that it would be desirable to have on-chip devices that provide the same functionality.

BRIEF DESCRIPTION OF THE DRAWINGS

The present disclosure may be better understood with reference to the following figures. Matching reference numerals designate corresponding parts throughout the figures, which are not necessarily drawn to scale.

FIG. 3A shows the filter vibrating in an in-phase mode, FIG. 3B shows the filter vibrating in an out-of-phase mode, FIG. 3C shows a predicted band-pass frequency response for the filter, and FIG. 3D shows an electrical equivalent circuit model for the filter.

DETAILED DESCRIPTION

Figure 1:
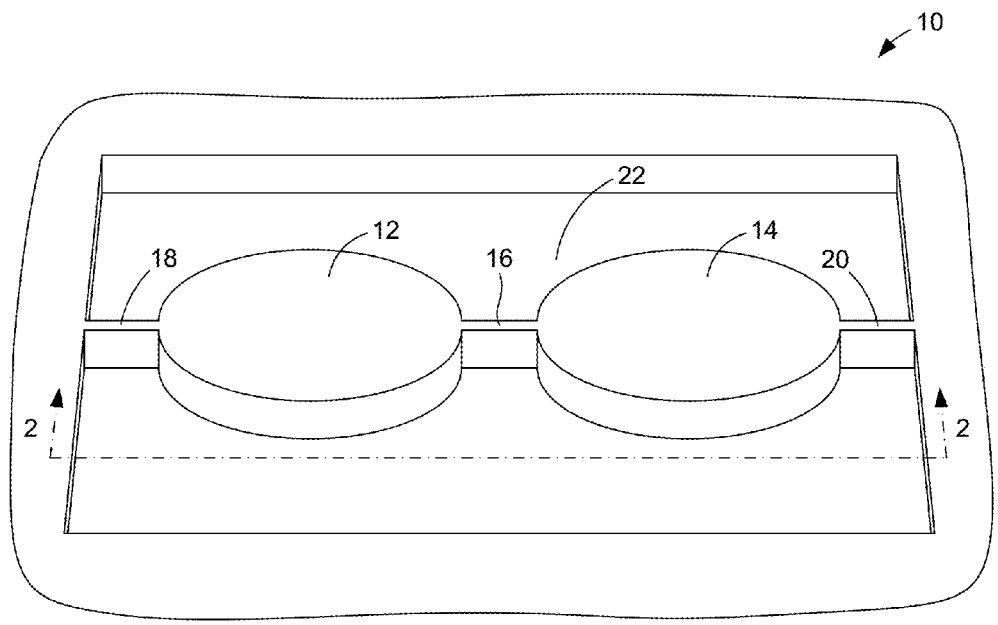
FIG. 1 is a perspective view of an embodiment of a piezoelectrically transduced micromechanical band-pass filter that incorporates mechanically coupled micromechanical resonators.

As described above, it would be desirable to have on-chip devices that provide the same functionality as devices used in heterodyne architecture transceiver systems but that avoid their drawbacks. More particularly, it would be desirable to have small devices that provide high quality factor (Q), low insertion loss, and low motional resistance so as to enable on-chip integration with 50Ω electronics. Disclosed herein are micromechanical devices incorporating piezoelectric resonators that satisfy this desire. In some embodiments, the devices are configured as band-pass filters that can be used in radio frequency (RF) front ends. In some embodiments, the filters comprise an array of subfilters that are mechanically coupled in parallel, with each subfilter including two or more piezoelectric resonators mechanically coupled in series.

In the following disclosure, various specific embodiments are described. It is to be understood that those embodiments are example implementations of the disclosed inventions and that alternative embodiments are possible. All such embodiments are intended to fall within the scope of this disclosure.

One of the most extensively pursued topics of RF integrated circuit (RFIC) designers is the miniaturization of communication electronic devices while improving performance, reducing size, power, consumption, and weight, and further minimizing fabrication costs. Consequently, a technology that can fulfill all these coveted requirements is highly desirable. Recent advances of complementary metal-oxide-semiconductor (CMOS)-compatible micro-electro-mechanical-systems (MEMS) technology have made possible the fabrication of on-chip RF-MEMS components, such as inter-graded inductors, tunable capacitors, RF-MEMS switches, and voltage controlled oscillators (VCO) based on capacitively transduced micromechanical resonators.

Besides the obvious size and power consumption reduction, new transceiver architectures based on RF-MEMS technologies can enable a new generation of reconfigurable multi-band telecommunication systems in which a single transceiver integrated circuit (IC) chip can provide several functions operating over a wide frequency range, thereby eliminating the need for multiple transceivers when additional functionalities and services are required.

Despite the high Q and wide frequency range achieved by capacitively transduced micromechanical resonators, their large motional resistance (>1 MΩ in some cases) is too high to match with the standard 50Ω impedance of today's RF components.

Piezoelectric transduction offers orders of magnitude higher electromechanical coupling coefficients than capacitive transducers for similar resonator geometry. Therefore, the low motional impedance enabled by the more efficient electromechanical transduction makes piezoelectric resonators desirable for use in the current mobile communication market. In contrast with capacitive devices, in which any conductive material can be used as a device layer, piezoelectric devices rely on the piezoelectric effect that only exists in piezoelectric materials, such as quartz ($SiO_2$), zinc oxide (ZnO), aluminum nitride (AlN), barium titanate ($BaTiO_3$), and lead-zirconate-titanate (PZT).

Currently, the two most important classes of piezoelectric resonators are surface acoustic wave (SAW) resonators and bulk acoustic wave (BAW) resonators. SAW resonators are widely employed to implement filters at frequencies lower than 2 GHz. However, for wireless communications standards that require frequencies higher than 2 GHz, it becomes difficult to implement low-loss and sharp-cut off filters using SAW technology. The quality factor for a SAW resonator decreases at higher frequencies and the size of the electrodes starts to approach sub-micron scale, thus forcing the employment of nonstandard photolithography fabrication techniques (i.e., electron-beam lithography).

Filters based on BAW resonators have attracted attention because of their simple electrode design, higher quality factor, sharp cut-off shape, high frequency range, and the possibility of implementing monolithic filters alongside of active RF components (i.e., amplifiers, mixers, etc.). At the moment, two main variants of BAW filters have been successfully commercialized on the wireless market: thin film bulk acoustic resonators (FBARs) in which the resonant structure isolated from the carrier substrate via air cavity suspension, and solid mounted resonators (SMRs), which use Bragg's acoustic reflectors as isolation from the carrier substrate.

Despite the current dominance of FBAR devices in the RF filter market, they suffer from a major limitation because their resonance frequency is set by the thickness of the piezoelectric film. Therefore, in order to achieve precise frequencies, the thickness of the piezoelectric film must be accurately controlled. Moreover, only devices operating at one specific frequency can be fabricated in one process run. Present-day wireless technology calls for multi-mode and multi-functional single-chip transceivers that operate at different frequencies as opposed to several discrete components integrated on board level.

Figure 2:
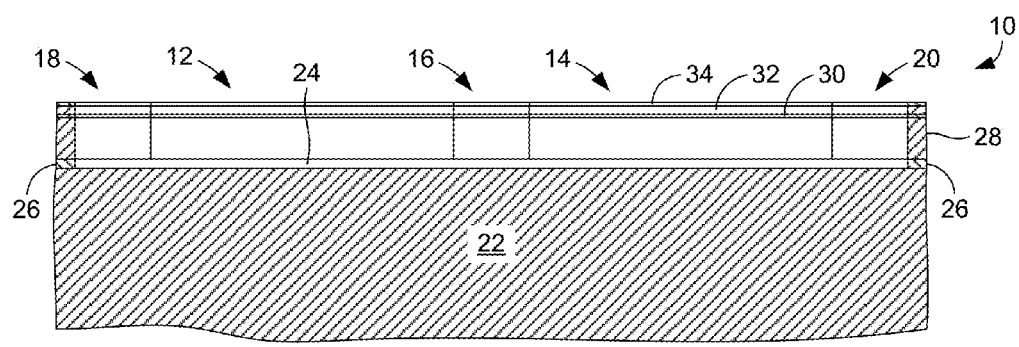
FIG. 2 is a cross-sectional view of the filter of FIG. 1.

FIGS. 1 and 2 illustrate a piezoelectrically transduced device that avoids the above-described limitations of devices that incorporate conventional piezoelectric resonators. More particularly, the figures illustrate a piezoelectrically transduced micromechanical band-pass filter 10 that incorporates mechanically coupled micromechanical resonators. The filter 10 is designed to operate at frequencies ranging from 50 MHz to 900 MHz while exhibiting insertion losses as low as 2 dB and filter termination resistances as low as 300Ω. The filter can be seamlessly integrated with 50Ω electronics by the proper design of LC impedance matching networks similar to those of SAW filters.

As shown in FIGS. 1 and 2, the filter 10 generally comprises first and second micromechanical resonators 12 and 14 that are mechanically coupled with a coupling beam 16. As is described below, the filter 10 can be used in a two-dimensional array of such filters, in which case the filter would be a subfilter of the array. Each resonator 12, 14 is configured as a piezoelectric disk resonator. In some embodiments, each resonator 12, 14 has a radius of approximately 5 to 500 μm. As is described below, the coupling beam 16 can have a length dimension that is a fraction of the resonance wavelength λ of the filter 10. For example, the length of the coupling beam 16 can be λ/2 or λ/4. As is also shown in the figures, the resonators 12, 14 connect with the remainder of the structure of the filter 10 with end beams 18 and 20. Like the coupling beam 16, the end beams 18, 20 can have a length dimension that is a fraction of the resonance wavelength λ of the filter 10. For example, the length of the end beams 18, 20 can be λ/2 or λ/4. As is most easily apparent from FIG. 2, the resonators 12, 14 and the beams 16-20 are suspended above a bottom substrate 22 so that an air gap 24 is created between those components and the substrate. This suspension enables the resonators 12, 14 to freely resonate when excited by an excitation voltage.

FIG. 2 further illustrates an example construction for the filter 10. In the illustrated embodiment, the filter's resonators 12, 14 are constructed as piezoelectric-on-substrate resonators using a silicon-on-insulator (SOI) wafer that comprises the substrate 22 (or handle layer), a buried oxide layer 26, and a device layer 28. The handle layer 22 is made of silicon and can be approximately 300-500 μm thick. The buried oxide layer 26 is typically made of a thermally grown oxide and can be approximately 1 to 2 μm thick. As can be appreciated from FIG. 2, part of the buried oxide layer 26 has been removed to form the air gap 24 and enable suspension of the resonators 12, 14. The device layer 28 can be made of single crystalline silicon and can be approximately 5 to 20 μm thick. The device layer 28 forms the majority of the structure of the resonators 12, 14 and therefore predominantly determines the resonators' mechanical properties.

Formed on the device layer 28 is a bottom electrode 30 that can be made of a metal material, such as platinum or aluminum, and can be approximately 150 to 200 nm thick. Formed on the bottom electrode 30 is the piezoelectric layer 32. The piezoelectric layer 32 is used to activate the resonators 12, 14 and is made of a suitable piezoelectric material, such as quartz, ZnO, AlN, PZT, or $BaTiO_3$. In some embodiments, the piezoelectric layer 32 is approximately 0.5 to 2.0 μm thick. Finally, a top electrode 34 is formed on the piezoelectric layer 32. The top electrode 34 is also made of a metal material, such as platinum or aluminum, and can also be approximately 150 to 200 nm thick.

During operation of the filter 10, an AC electrical signal representing an RF signal is applied to the filter using the electrodes 30, 34. By way of example, the signal can be received from a receive antenna (not shown) as an input into the left side of the filter 10. The frequency of the signal matches the resonance frequency of the piezoelectric material of the resonators 12, 14, which causes the material to resonate. In contour mode, the resonators 12, 14 resonate in the later (radial) directions in response to a vertical electric field that is generated when the signal is applied. The resonance of the coupled resonators 12, 14 provides a filtering function to the signal in the mechanical domain such that, when the signal exits the filter 10 (e.g., from the right), frequencies outside the desired band are attenuated.

Figure 3:
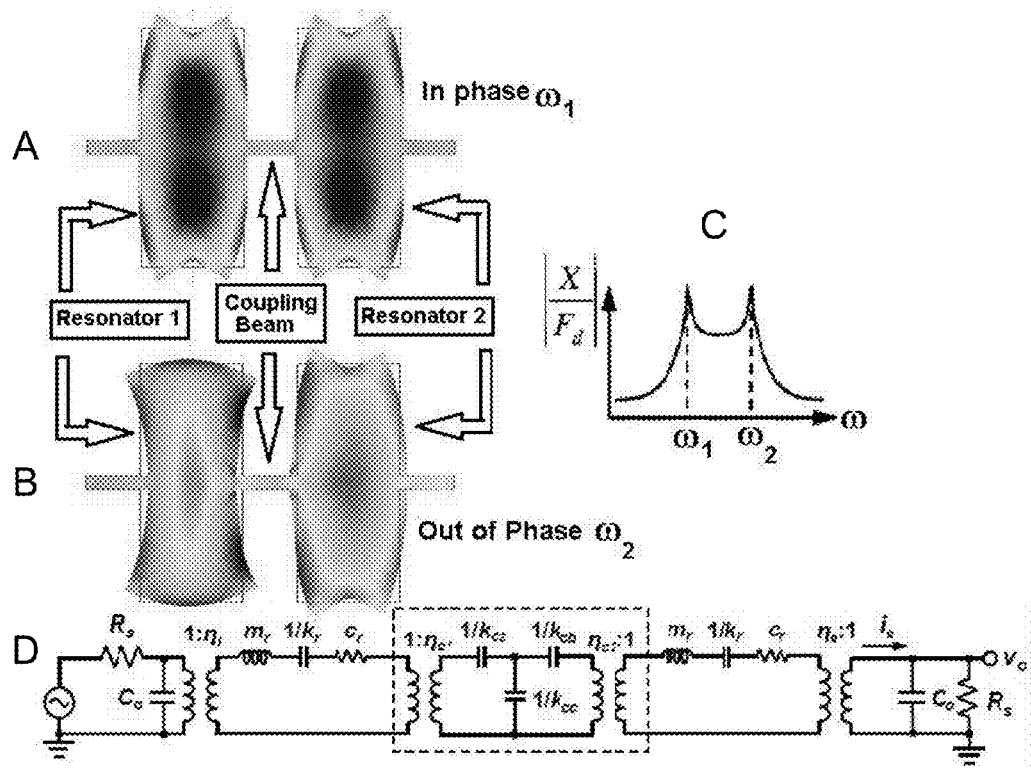
FIGS. 3A-3D illustrate the working principle for the filter shown in FIGS. 1 and 2.

FIGS. 3A-3D illustrate the working principle of the above-described filter in greater detail More particularly, these figures show the mode shapes, frequency response, and equivalent circuit model for a filter composed of two contour-mode resonators mechanically coupled by a longitudinal beam. In this coupled mechanical system, there are two types of modal vibrations. In the first low-frequency mode, both resonators move in phase while alternately stretching and compressing the coupling beam. In the second high-frequency mode, the two resonators move out-of-phase, thus leaving the coupling beam nearly unstressed. The filter passband is determined by the frequency difference between the aforementioned modes as shown in FIG. 3C. The simplified equivalent circuit is shown in FIG. 3D, where the mass-spring-damper parameters are represented as series LCR tanks and model the mechanical response of the individual resonators, and the spring constants are represented by the t-network capacitors and model the mechanical coupling beam between the constituent resonators. In addition, $\eta_i$ and $\eta_o$ represent the electromechanical coupling coefficient between the mechanical filter and the electrical input and output terminals, whose port capacitances are equal to $C_o$.

The center frequency of the filter is determined by the common resonance frequency of the constituent resonators and the filter bandwidth is designed by adjusting the equivalent stiffness ratio between the resonator and the coupling beam. The resonance frequency and equivalent stiffness at the coupling location of each resonator depends on its physical dimensions, its geometry (e.g., disk, ring, rectangular plates, etc.), and its mode shape. For instance, a mechanical resonator exhibits the highest equivalent stiffness at its nodal location when vibrating in a certain mode shape. As a result, a filter with a narrower bandwidth can be synthesized by positioning the coupling beam closer to the nodal location.

Figure 4A:
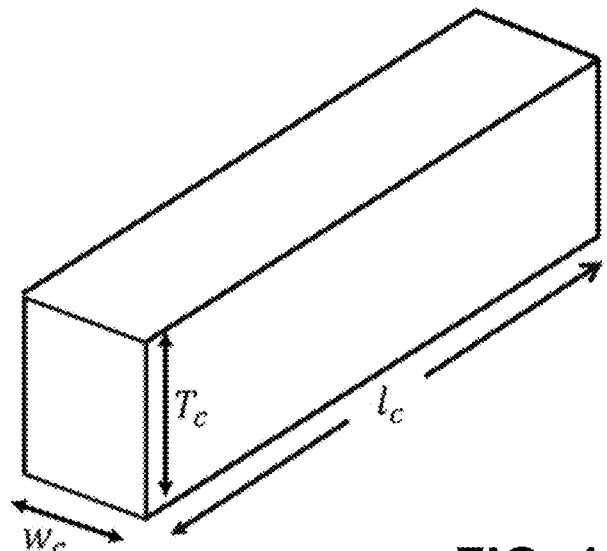
FIG. 4A is a schematic view of an extensional-mode coupling beam that can be used in a filter such as that shown in FIGS. 1 and 2.
Figure 4B:
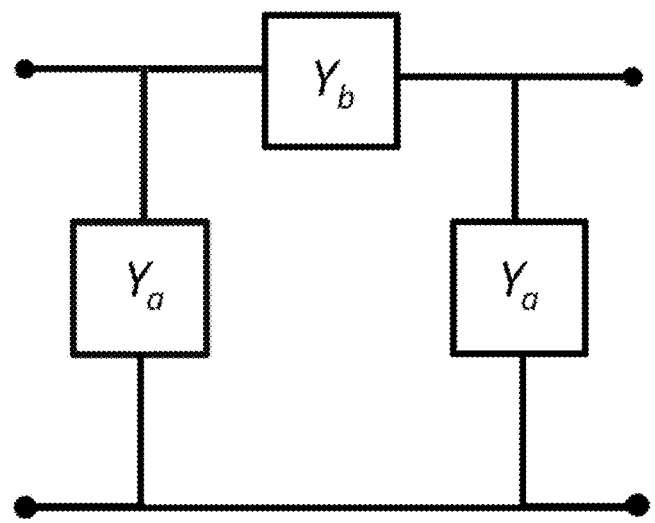
FIG. 4B is a schematic drawing of the equivalent transmission line $\pi$-model representation of the coupling beam of FIG. 4A.

The bandwidth of a mechanically coupled two-pole filter is proportional to the ratio of the coupling beam stiffness $k_s$ to the resonator stiffness $k_r$ at the coupling location, which is given by:

$$BW = \frac{k_s}{k_r}k_{12} \qquad \text{[Equation 1]}$$

where $k_{12}$ is the normalized coupling coefficient between resonator tanks for a given filter type. A Chebyshev filter can be chosen along with the corresponding coupling coefficient $k_{12}$. The stiffness of the resonator at the coupling location can be calculated as a function of its equivalent mass and resonance frequency. For the coupling beam, its stiffness can be modeled as an acoustic transmission line. FIGS. 4A and 4B show a schematic of an extensional-mode coupling beam with dimensions of $w_c$ (width), $T_c$ (thickness), and $l_c$ (length) and its equivalent transmission line π-model.

The value of the acoustic impedances $Y_b$ and $Y_a$ in FIG. 4B are functions of the material properties and coupling beam dimensions given by:

$$Z_0 = \frac{1}{w_c T_c \sqrt{\rho E}} \qquad \text{[Equation 2]}$$

$$\alpha = 2\pi f_0 \sqrt{\frac{\rho}{E}} \qquad \text{[Equation 3]}$$

$$Y_b = \frac{-j}{Z_0 \sin \alpha l} \qquad \text{[Eqation 4]}$$

$$Y_a = \frac{-j\tan(\alpha l/2)}{Z_o} \qquad \text{[Equation 5]}$$

where E and β are the Young's modulus and the material density of the coupling beam, respectively, while $f_o$ is the resonance frequency. From FIG. 4B, the transformers turn ratios associated with the coupling beam, $\eta c_1$ and $\eta c_2$, model the mechanical impedance transformation realized by coupling one resonator to the other. Ideally, if the coupling beam is connected at the same location of both constituent resonators, the values for $\eta c_1$ and $\eta c_2$ are equal to one, which means that all the mechanical energy is transferred by the coupling beam between the resonators.

Figure 5:
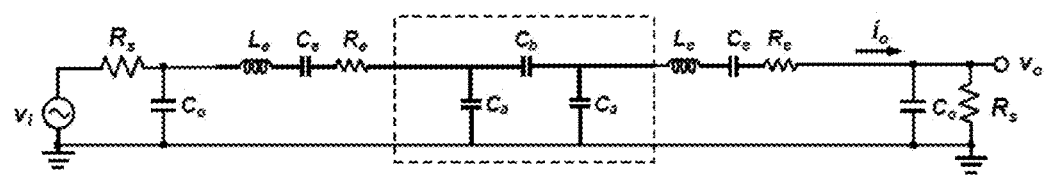
FIG. 5 is a schematic drawing of an electrical model for a micromechanical filter composed of two identical coupled resonators.

Two special cases are particularly interesting. Under the first case, the length of the coupling beam is equal to half of the wavelength (λ/2). In such a case, the composite resonator array behaves as a single resonator with a resonance frequency equal to that of its constituent resonator. Under the second case, when the length of the coupling beam is equal to one quarter of the wavelength (λ/4), the composite array behaves as a coupled resonator filter, with the bandwidth of the passband given by Equation 1. Even though the effect of a coupling beam's length on the frequency response of the filter can be modeled by Equations 2-5, it may be preferable to use λ/4-long coupling beam(s) while changing the width of the beam in order to adjust the bandwidth of the filter. It is worth mentioning that the resonators and the coupling beam(s) usually have the same thickness, and, therefore, the thickness parameter does not affect the ratio of the coupling beam stiffness $k_s$ to the resonator stiffness $k_r$, which determines the filter bandwidth. The electrical equivalent circuit for a mechanically coupled piezoelectric resonator filter comprises two identical resonators coupled by a longitudinal extensional beam modeled as π-network capacitors, as shown in FIG. 5.

In order to illustrate the behavior of a mechanically coupled two-pole resonator filter, a finite-element simulation of the frequency response of a mechanical filter with two mechanically coupled and identically sized 30 μm radius piezoelectrically transduced disk resonators was performed. The resonator comprised a 500 nm thick ZnO layer embedded between 150 nm thick platinum bottom and top electrodes. The values for the parameters of the equivalent electrical model are summarized in Table 1.

TABLE 1

Equivalent electrical circuit parameters for a mechanically coupled filter with different coupling beam lengths

| Parameter | λ/4 | λ/3 | λ/2 |
|---|---|---|---|
| $R_{eq}$ | 1.47 kΩ | 1.47 kΩ | 1.47 kΩ |
| $C_{eq}$ | 2.5923 fF | 2.5923 fF | 2.5923 fF |
| $L_{eq}$ | 5.6569 mH | 5.6569 mH | 5.6569 mH |
| Q | 1,000 | 1,000 | 1,000 |
| $f_0$ | 41.513 MHz | 41.513 MHz | 41.513 MHz |
| $C_a$ | 0.1182 pF | 0.2070 pF | −11.654 pF |
| $C_b$ | −0.1182 pF | −0.1370 pF | 5.827 pF |

Figure 6:
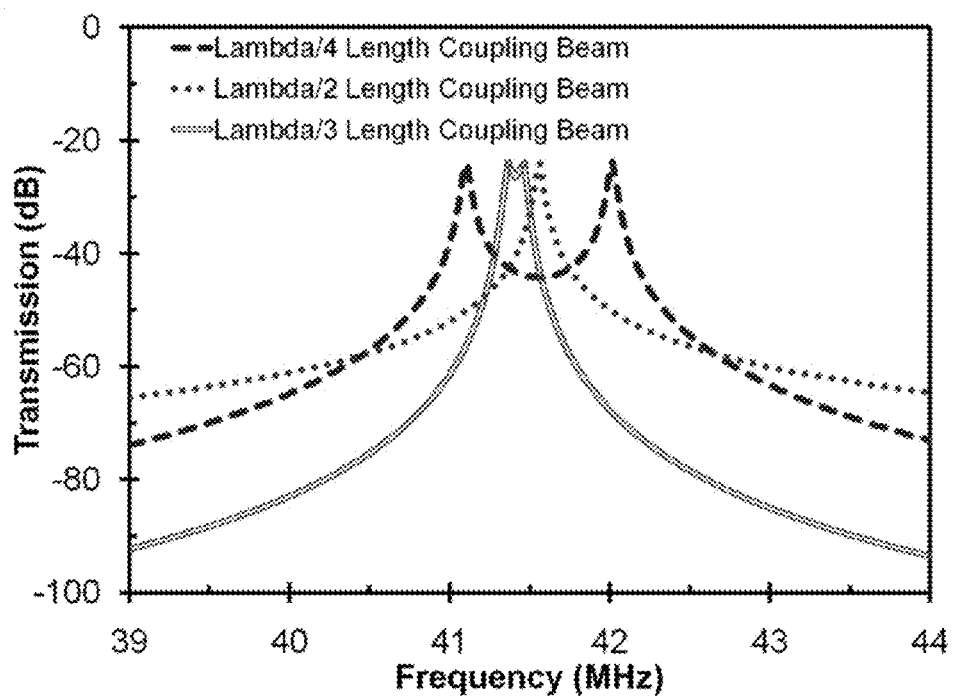
FIG. 6 is a graph that shows the frequency response for a mechanically coupled filter with different coupling beam lengths.

As expected for the case in which the coupling beam length is equal to λ/2, the coupled system behaves like a single resonator. When the length of the coupling beam is equal to λ/4, the system behaves as a filter with its bandwidth defined by Equation 1. However, when the length of the coupling beam is equal to λ/3, the coupled resonator array still behaves as a filter, but the design of the coupling beam affects the center frequency and the bandwidth of the synthesized filter. Nevertheless, this behavior can be accurately modeled and may be beneficial when the fabrication-process tolerance limits the minimum achievable width of the coupling beams. The simulation results presented in FIG. 6 show the frequency responses (especially the bandwidth) of a pair of mechanically coupled resonators with a variety of coupling beam lengths. It is noted, however, that these coupled resonator filters were not properly terminated as the termination resistance was set to 50Ω. Also, for simplicity, the feed through capacitance and the device input/output capacitances were not included in the simulation.

Figure 7:
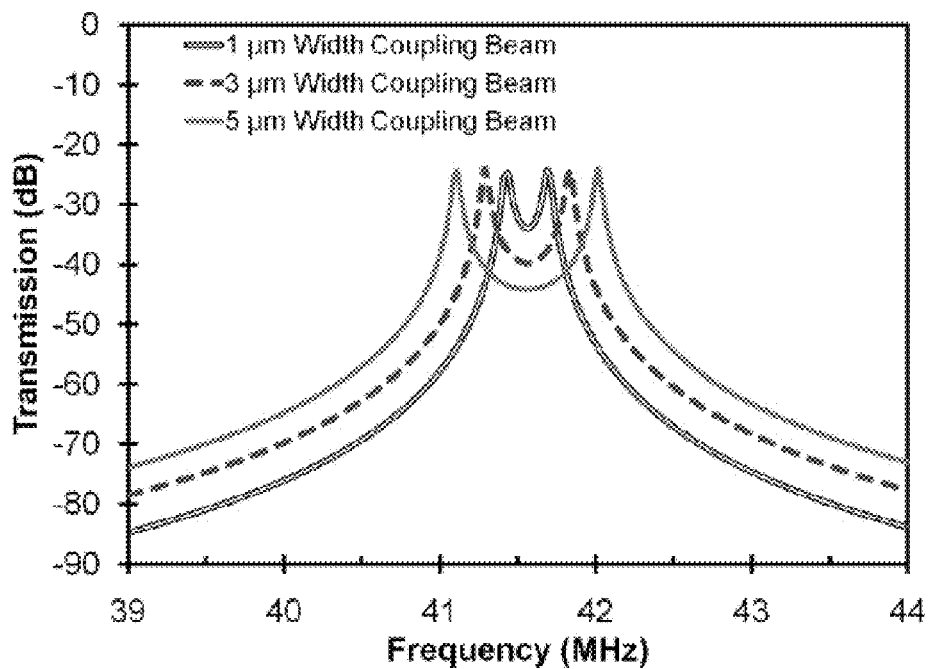
FIG. 7 is a graph of the frequency response for a mechanically coupled filter with different coupling beam widths.

As mentioned earlier, the bandwidth of a mechanically coupled filter can be designed by changing the stiffness of the coupling beam. If the length is equal to λ/4, the only parameter that can be changed via CAD layout is the width of the coupling beam. To illustrate this concept, FIG. 7 shows the finite element simulation results for a mechanically coupled filter including two identical 30 μm radius piezoelectrically transduced disk resonators coupled via a λ/4 beam having different widths.

TABLE 2

Equivalent electrical circuit parameters for a mechanically coupled two-pole resonator filter with different coupling beam widths

| Parameter | λ/4 (1 μm-wide) | λ/4 (3 μm-wide) | λ/4 (5 μm-wide) |
|---|---|---|---|
| $R_{eq}$ | 1.47 kΩ | 1.47 kΩ | 1.47 kΩ |
| $C_{eq}$ | 2.5923 fF | 2.5923 fF | 2.5923 fF |
| $L_{eq}$ | 5.6569 mH | 5.6569 mH | 5.6569 mH |
| Q | 1,000 | 1,000 | 1,000 |
| $f_0$ | 41.513 MHz | 41.513 MHz | 41.513 MHz |
| $C_a$ | 391.1 pF | 118.2 pF | 198.1 pF |
| $C_b$ | −396.1 pF | −118.2 pF | 198.1 pF |

Compared with conventionally cascaded ladder filters based on FBAR resonators, it is advantageous to be able to synthesize the filter bandwidth by changing a physical dimension (i.e., width of the coupling beam) that can be accurately designed by the CAD layout. Ideally, the width of the beam can be selected based upon the desired filter bandwidth. However, the minimum beam width is limited by the lowest resolution achievable with the fabrication technology. The upper limit is limited by the point where the coupling beam is so wide that it starts to distort the frequency response of the synthesized filter and lower its quality factor.

Figure 8A:
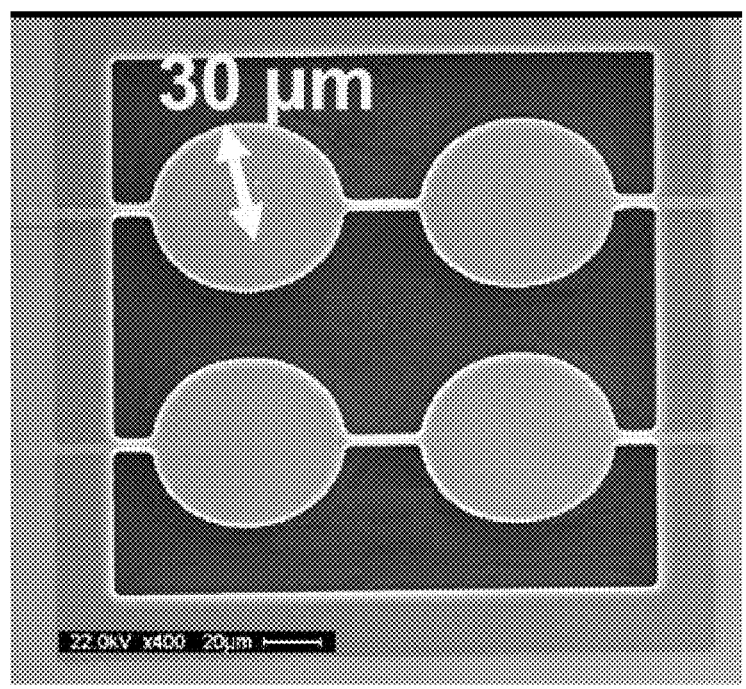
FIG. 8A is a SEM micrograph of a fabricated filter 2×2 micromechanical contour mode filter with 30 μm radius disk piezoelectric resonators as constituent elements.
Figure 8B:
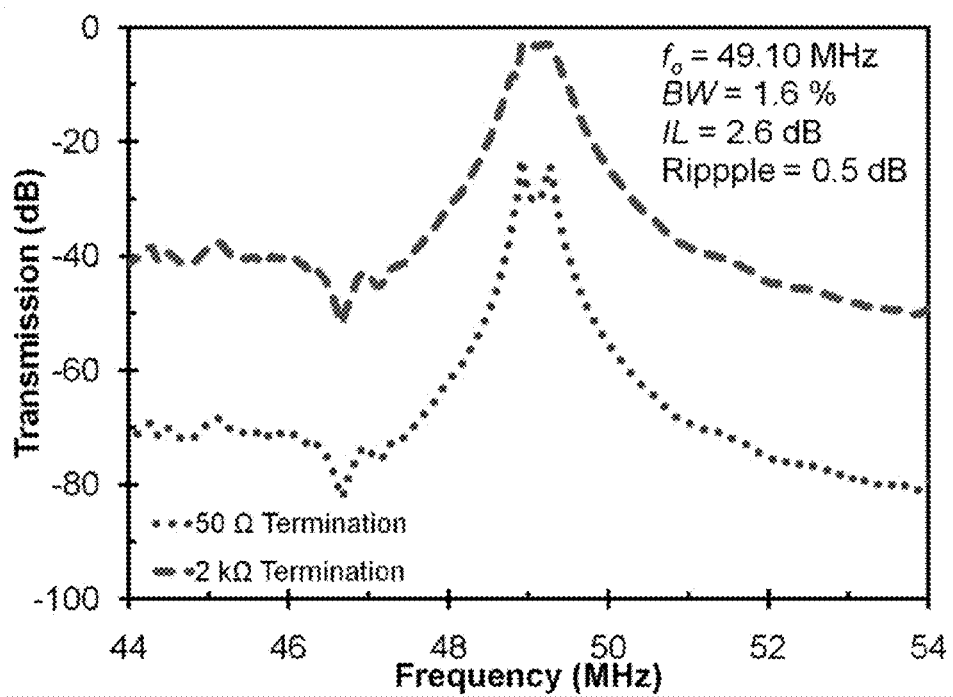
FIG. 8B is a graph of the frequency response for the filter of FIG. 8A.

Two-dimensional arrays of mechanically coupled contour-mode resonator disk and rectangular plate geometries were also fabricated for testing purposes. The fabricated filters comprised chains of 2, 4, 6, 9, and 20 disk resonators having either a 20 μm radius or 30 μm radius and operating in its 1st and 2nd radial contour-modes. A first mechanically coupled filter comprising a chain of four mechanically coupled resonators is shown in FIG. 8A. The measured frequency response of the filter is shown in FIG. 8B. The filter comprised two 30 μm radius piezoelectrically transduced disk resonators connected by a λ/4 coupling beam. A 700 nm thick ZnO film was deposited and embedded between 130 nm thick platinum bottom and top electrodes. Another chain of two mechanically coupled resonators were electrically connected in parallel in order to reduce the effective motional resistance, thus decreasing termination resistance of the filter. The coupling beams were designed to be λ/4 in length. However, uncertainties in exact value of the materials properties, such as Young's Modulus and residual stress of the film, have shifted the central frequency of the filter from the expected values. The quality factor of each constituent resonator was roughly 800, which is sufficient for synthesizing filters with bandwidth higher than 0.5% while obtaining low insertion loss of less than 2.6 dB. The kΩ termination resistor was employed in order to load the quality factor of each constituent resonator and flatten the passband. As compared to standard 50Ω electronics and testing instruments, the 2 kΩ termination resistor is 40 times larger. One could expect that resonators with higher Q can be leveraged to get better filter characteristics. However, given the higher Q of the constituent resonators, such a filter would require a larger termination resistance in order to flatten the filter passband. An alternative solution to this problem would be to increase the total number of electrically-coupled resonators in parallel as a single composite resonator. The reduction of the termination resistance will be inversely proportional to the number of subfilters that operate in parallel. Ideally, there is no limit to the number of subfilters that can be implemented in parallel. However, in a practical filter implementation, the parasitic capacitances (i.e., $C_o$ and $C_f$) introduced by each additional subfilter and the chip area constraint would impose an upper limit.

Figure 9A:
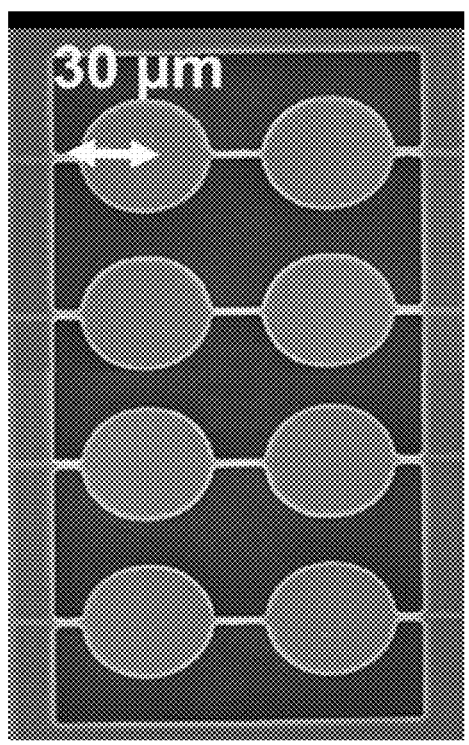
FIG. 9A is a SEM micrograph of a fabricated 4×2 micromechanical contour mode filter with 30 μm radius disk piezoelectric resonators as constituent elements.
Figure 9B:
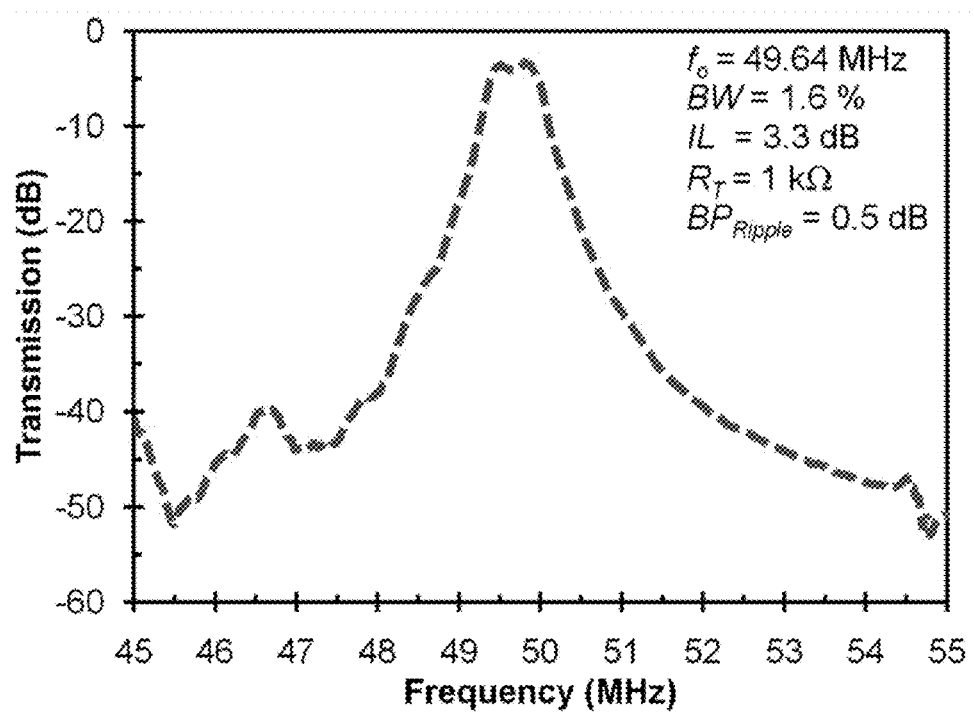
FIG. 9B is a graph of the frequency response for the filter of FIG. 9A.

The frequency response for a second-order mechanically coupled filter with four subfilter chains connected in parallel is shown in FIG. 9A. As can be observed from FIG. 9B, the termination resistance for this filter is lower as compared to the device with only two subfilters shown in FIG. 8A. The center frequency of the filter of FIG. 9A has been shifted up slightly and the bandwidth was increased from 1.3% to 1.6%, which should be attributed to the fabrication variation rather than the addition of a third subfilter chain. In addition, the value of the termination resistance was decreased from 2 kΩ to 1 kΩ, which was expected due to the addition of an extra subfilter. Nevertheless, the motional resistance can be decreased even further if more subfilter chains are introduced.

Figure 10:
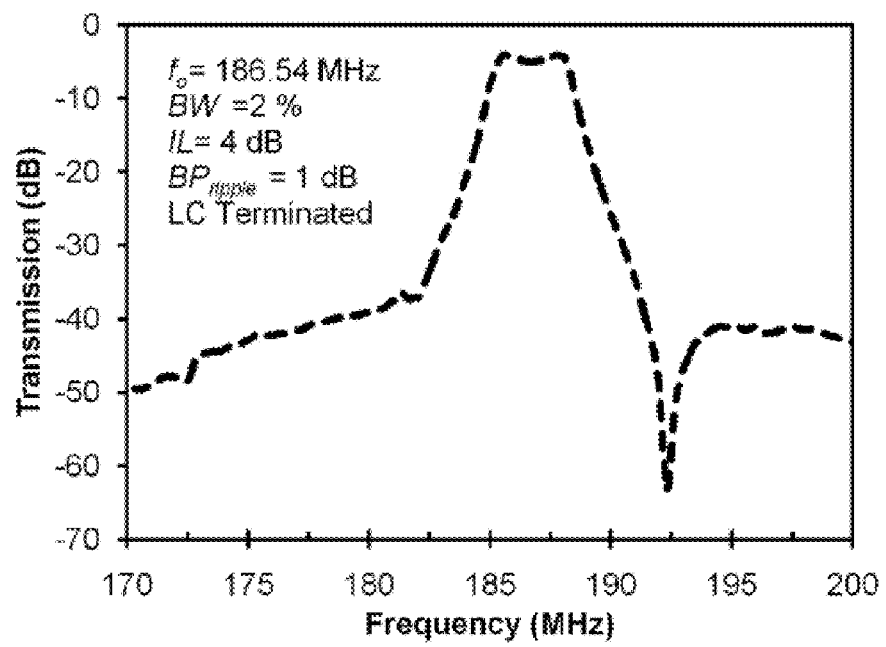
FIG. 10 is a graph of the frequency response for a 3×3 micromechanical contour-mode filter composed of two mechanically coupled 20 μm radius ZnO thin film piezoelectric disk resonators.

If a filter operating at a higher frequency band needs to be designed, the size of the constituent resonator can be adjusted and the length and the width of the coupling beam can be calculated depending on the desired operation frequency and bandwidth of the filter. A filter comprising two 20 µm radius piezoelectrically transduced disk resonators coupled by a 15 µm long and 5 µm wide coupling beam was also fabricated. The measured frequency response for this device is shown in FIG. 10.

Although contour-mode resonators based on circular plates and rings using an electrostatic transduction mechanism have been demonstrated at GHz frequencies, they have large motional impedances, which hinders their direct integration with 50Ω electronics. Moreover, some of the tested capacitively transduced filters require a special de-emending technique in order to cancel the parasitics from the carrier substrate and the constituent resonators in order to match the filter to a feasible termination resistance. On the contrary, filters synthesized with arrays of mechanically coupled disk resonators equipped with piezoelectric transducers such as those disclosed herein can be successfully matched to 50Ω termination resistances for frequencies up to the GHz range without the need of de-embedding techniques.

Figure 11:
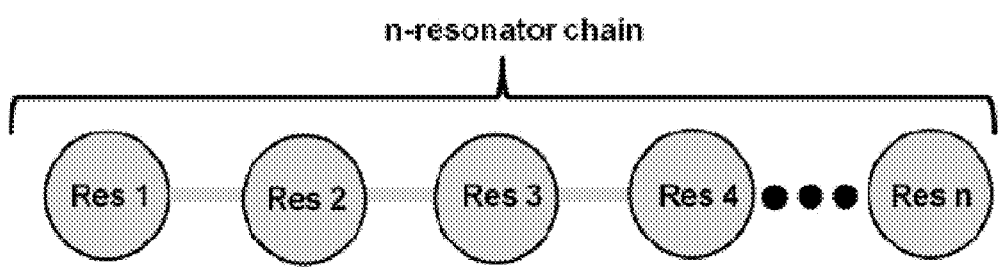
FIG. 11 is a schematic representation of a mechanically coupled filter comprising n-constituent resonators.

The synthesized filters described thus far have shown better performance in terms of the insertion loss compared with conventional SAW devices operating at similar frequencies. However, they still lack the necessary shape factor for more demanding applications where high selectivity between the stopband and the passband is critical. In order to implement higher order filters, chains composed of more than two mechanically coupled resonators are needed. The explanation behind this is based on the fact that the order of a mechanically coupled filter is equal to the number of the coupled resonator LCR circuits in series. Therefore, the higher the order of the filter, the better the selectivity of the filter. Ideally, the number of mechanically coupled resonators in a filter can be as high as necessary to fulfill a specific shape factor imposed by the target application. However, in a practical filter implementation, the number of the resonators in the filter will depend on the size constraints and the tolerances imposed by the fabrication process. The concept of an n-order filter having n resonators connected in series is illustrated in FIG. 11.

Filters implemented based upon this topology could also benefit from the employment of parallel subfilters in order to decrease the effective motional resistance of the filter. When the quality factors of the constituent resonators are not extremely high (Q<1,000), filters based on the topology shown in FIG. 11 can be implemented without degrading the overall performance. This topology was adopted with open chains of 2×2 resonators and 3×3 resonators for the measurement results presented in FIGS. 8 and 9, respectively. However, for a filter configuration where the Q's of the constituent resonators are higher than 1,000, minor differences in the parallel chains will degrade the performance of the filter.

Figure 12:
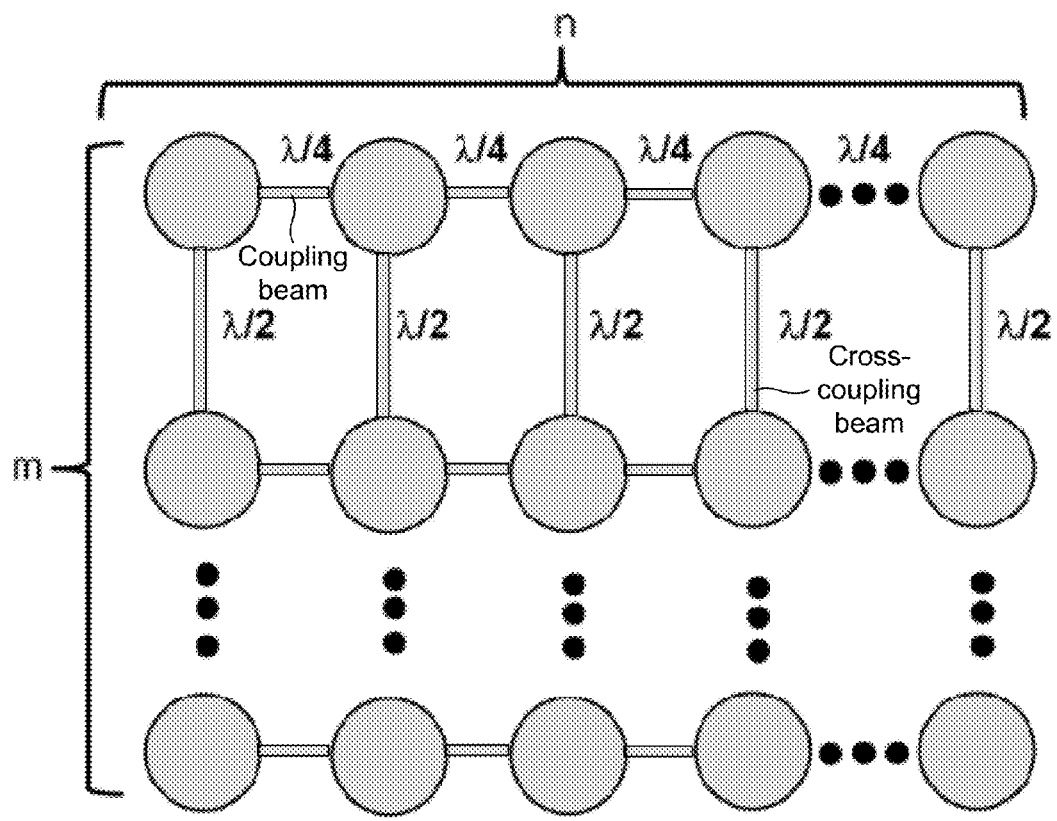
FIG. 12 is a schematic representation of a loop-coupled filter comprising a two-dimensional array of mechanically coupled n×m constituent resonators.

One method to improve the performance of an open-chain filter is to connect each subfilter to its neighboring subfilter(s) in parallel within a two dimensional array using cross-coupling beams, as shown in FIG. 12. This forces each subfilter chain to resonate at the same frequency, thus decreasing the effect of both the frequency variation of each individual subfilter and the quality factor of each constituent resonator on the array. In the example of FIG. 12, the resonators of each subfilter are coupled with λ/4 coupling beams and adjacent resonators of adjacent subfilters are coupled with λ/2 cross-coupling beams.

To address the aforementioned issues related to the variations in the quality factor, resonance frequency, and material properties of mechanically coupled filters, a close-chain filter topology that utilizes λ/2 cross-coupling beams instead of λ/4 cross-coupling beams for connecting parallel subfilter chains, was implemented. This approach presents several advantages as compared with conventional close-chain filter configurations. The order of the filter is not only defined by the number of the coupled resonators in series to allow more design flexibility. Hence, a filter with a passband characteristic of a second order filter can be designed with the anticipated shape factor of a 4th-order filter. Moreover, this array is less sensitive to the coupling beam length variation, and the motional resistance can be reduced by m times the number of parallel arrays.

Figure 13A:
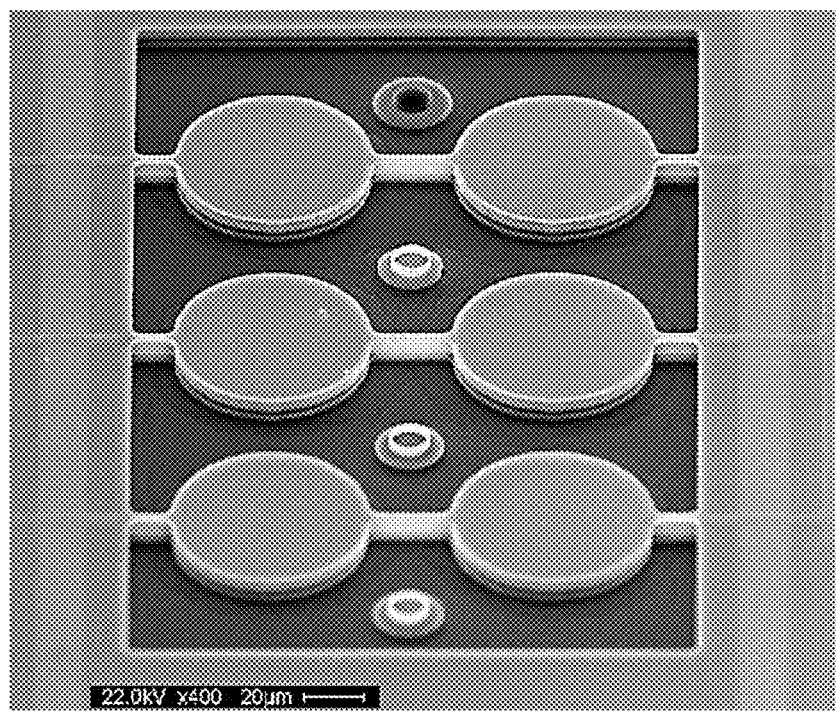
FIG. 13A is a SEM micrograph of a fabricated 3×2 micromechanical contour-mode filter that comprises an array of a 20 μm radius disk resonator fabricated using a SOI wafer with a 5 μm thick silicon device layer.
Figure 13B:
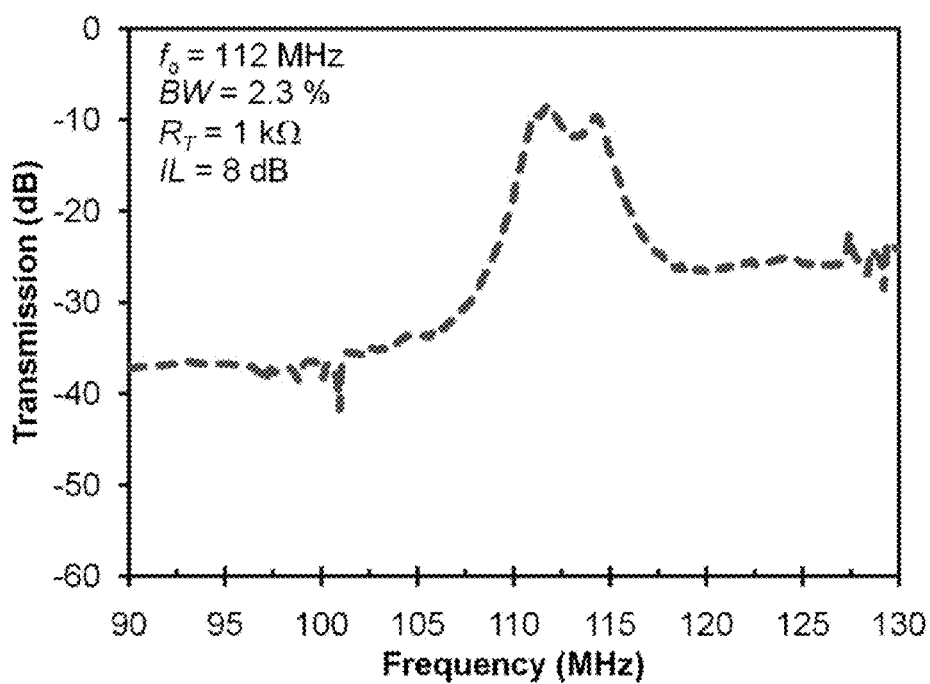
FIG. 13B is a graph of the frequency response for the filter of FIG. 13A.

FIG. 13A shows a mechanically coupled filter composed of 20 µm-radius ZnO-on-silicon piezoelectrically transduced disk resonators as constituent elements. FIG. 13B shows the frequency response for the filter. The device was fabricated using a SOI wafer with a 5 µm thick silicon device layer. The filter comprised three subfilters each having two mechanically coupled resonators (i.e., a 3×2 array). The subfilters were not linked to each other with cross-coupling beams. Because the order of the filter is equal to the number of resonators connected in series, the order for this case was two.

Figure 14A:
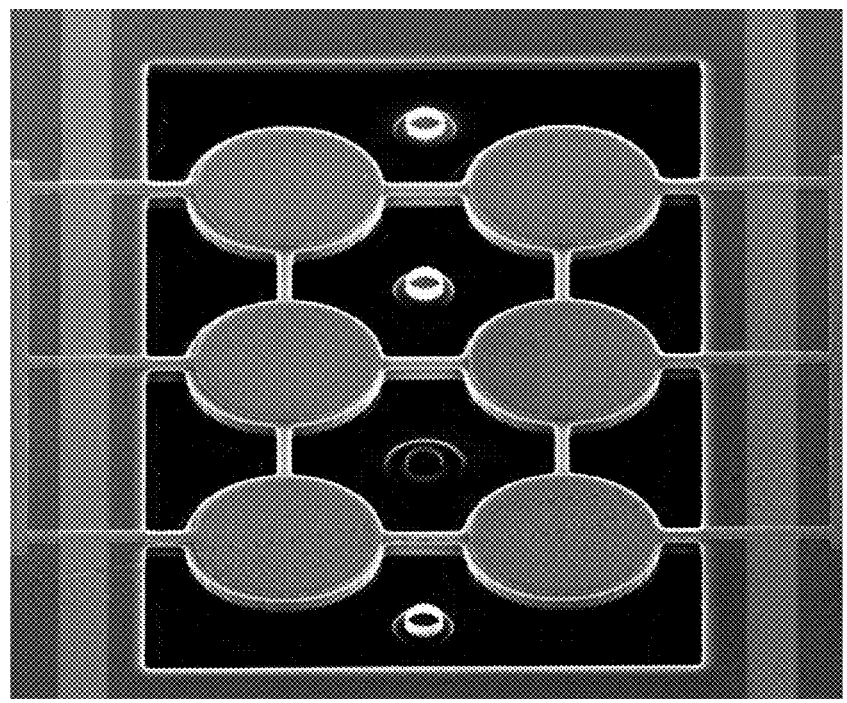
FIG. 14A is a SEM micrograph of a fabricated 3×2 micromechanical contour-mode filter composed of an array of 20 μm radius disk resonators linked by $\lambda/4$ coupling and cross-coupling beams fabricated using a SOI wafer with a 5 μm thick silicon device layer.
Figure 14B:
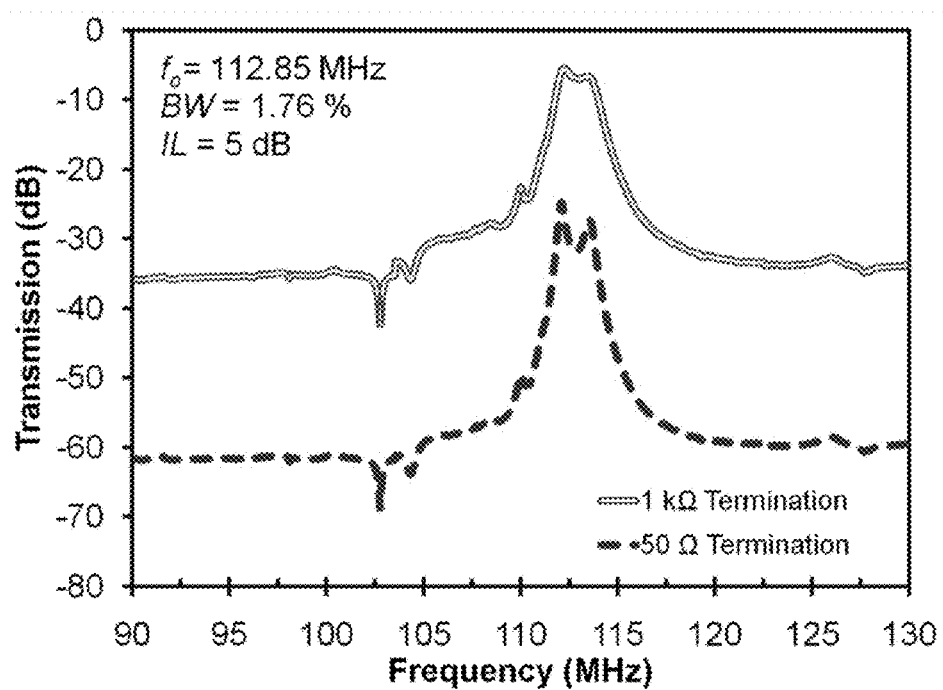
FIG. 14B is a graph of the frequency response for the filter of FIG. 14A.

The same filter was then re-constructed as a 3×2 array of identically-sized constituent disk resonators that were connected by λ/4 (instead of λ/2) cross-coupling beams, as shown in FIG. 14A. Notably, the cross-coupling beams did not comprise electrodes and therefore do not independently vibrate when the signal is applied. In such a case, the coupled array should then behave as a 6th-order filter. If the termination resistance is kept the same for both cases (FIGS. 13 and 14) in order to make a fair comparison, the passband of the 6th-order filter should be more flat, and ideally the insertion loss should be at least the same or lower. As seen in FIG. 14B, both the insertion loss and the passband of the filter have been improved. Particularly, the response of the filter became much sharper. As mentioned previously, the termination resistance was retained for both filters because they ideally have the same motional resistance (both filters have the same number of parallel subfilters).

Figure 15A:
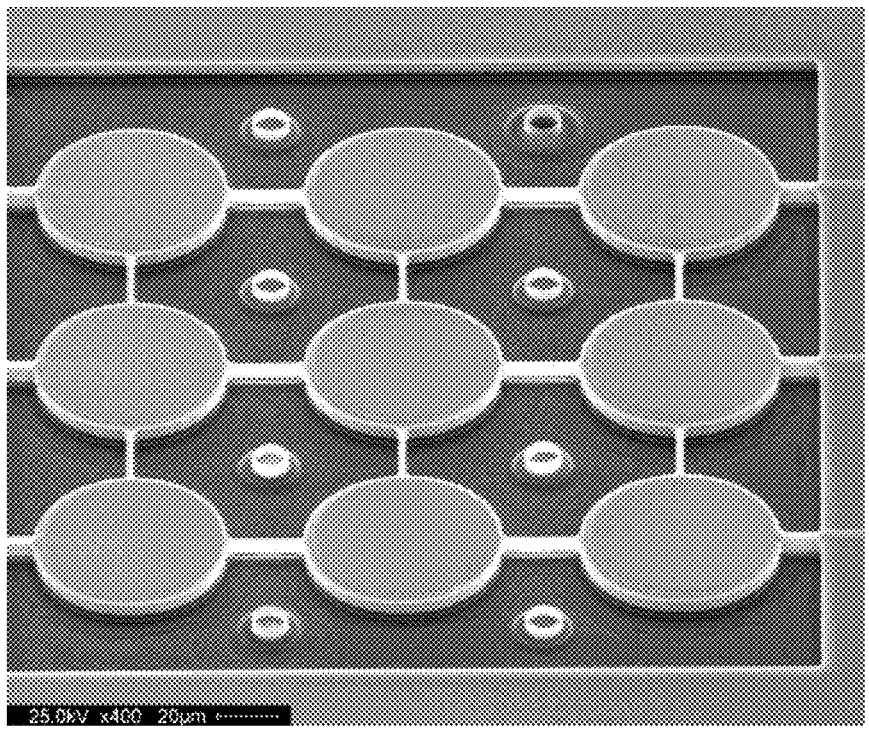
FIG. 15A is a SEM micrograph of a fabricated 3×2 micromechanically coupled filter that comprises an array of 20 μm radius disk resonators coupled with $\lambda/4$ coupling and cross-coupling beams fabricated using a SOI wafer with a 5 μm thick silicon device layer.
Figure 15B:
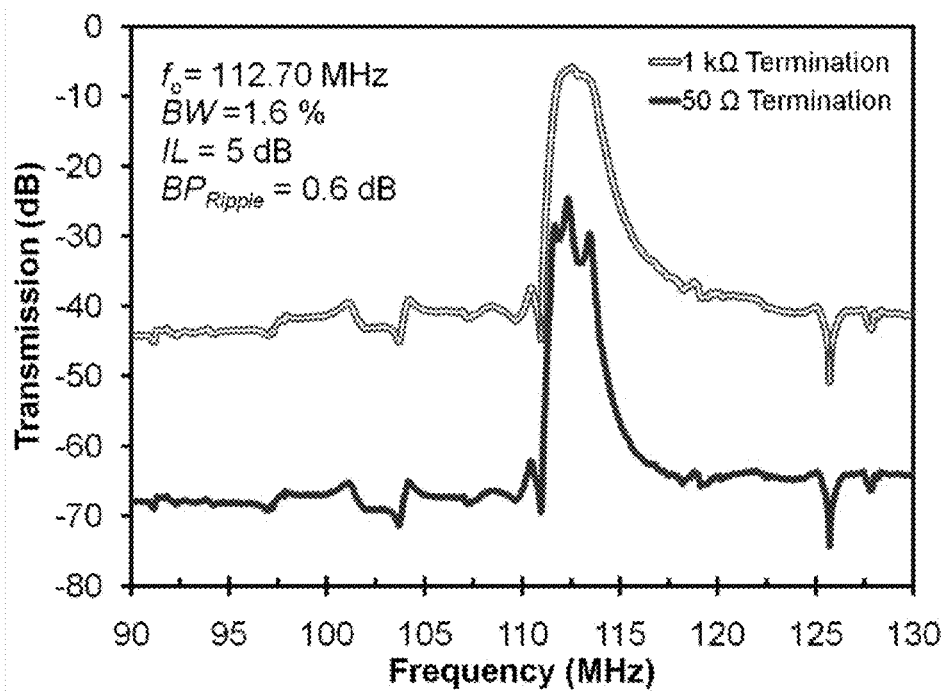
FIG. 15B is a graph of the frequency response for the filter of FIG. 15A.

If the number of resonators connected in series is increased while keeping the number of parallel subfilters, a 9th-order filter could be implemented with a 3×3 mechanically coupled resonator array connected in close chain configuration as shown in FIG. 15A. The frequency response for such a filter is also shown in FIG. 15B. As indicated in the figure, the filter exhibited a sharp shape factor that is more similar to that of a SAW filter operating in this frequency range. Although the filter was terminated with a termination resistance of 1 kΩ, this can be decreased to 50Ω if 64 subfilter chains are connected in parallel. Alternatively, the filter can be terminated with 50Ω if a proper L-matching network is inserted.

Figure 16A:
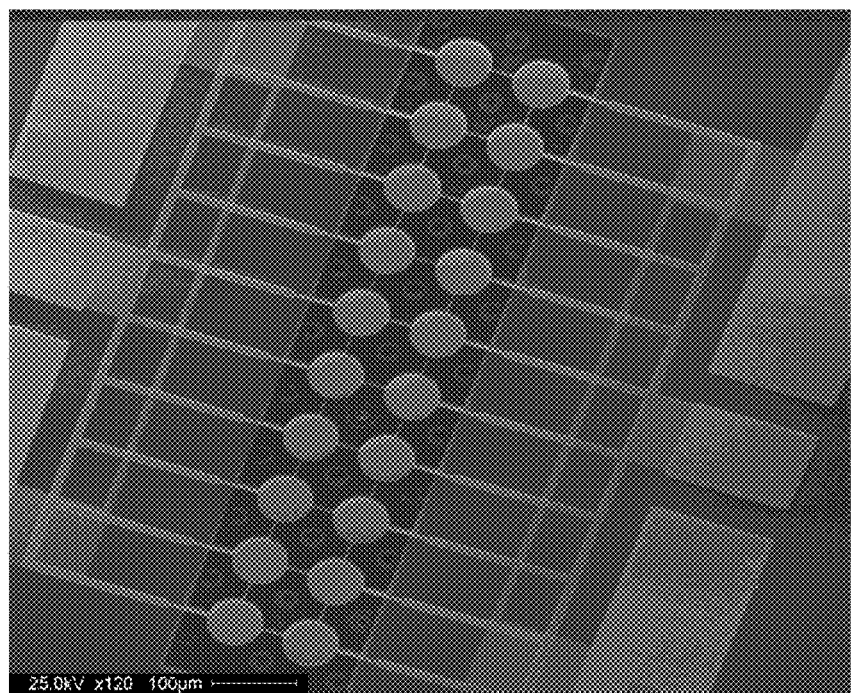
FIG. 16A is a SEM micrograph of a fabricated 10×2 micromechanically coupled filter with 30 μm radius disk constituent resonators coupled together.
Figure 16B:
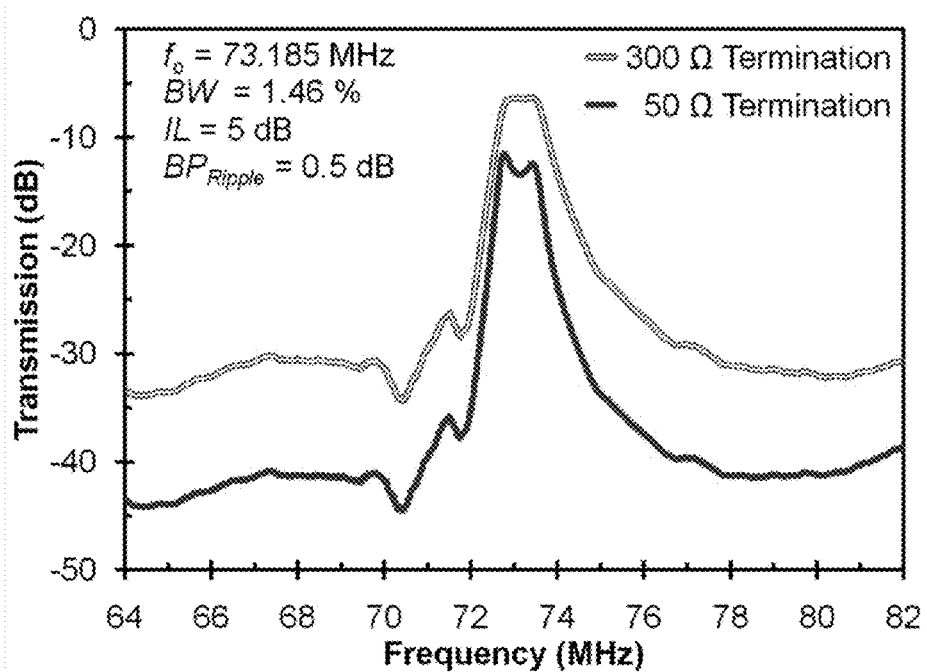
FIG. 16B is a graph of the frequency response for the filter of FIG. 16A.

FIGS. 16A and 16B show the SEM micrograph and the frequency response, respectively, for a two-pole mechanically coupled filter equipped with 10 subfilters connected in parallel. Each subfilter comprised two mechanically coupled 30 μm radius disk resonators fabricated using a SOI wafer with a 5 μm thick silicon device layer. The resonators operate in the fundamental radial contour mode at 73.2 MHz. The motional resistance of this device is 200Ω, which allows terminating the filter with a termination impedance as low as 300Ω. This filter shows a 10 time reduction in the termination impedance as compared with a single two-pole filter that is composed of a pair of mechanically coupled resonators. Important to achieving such performance is the employment of a ZnO-on-SOI piezoelectrically transduced disk resonator array as a composite resonator instead of stand-alone resonators. Moreover, it is also expected that the power handling capability for the coupled resonator array will be drastically increased. Aside from lowering the effective motional resistance, arraying has an impact on linearity and power handling ability.

Figure 17:
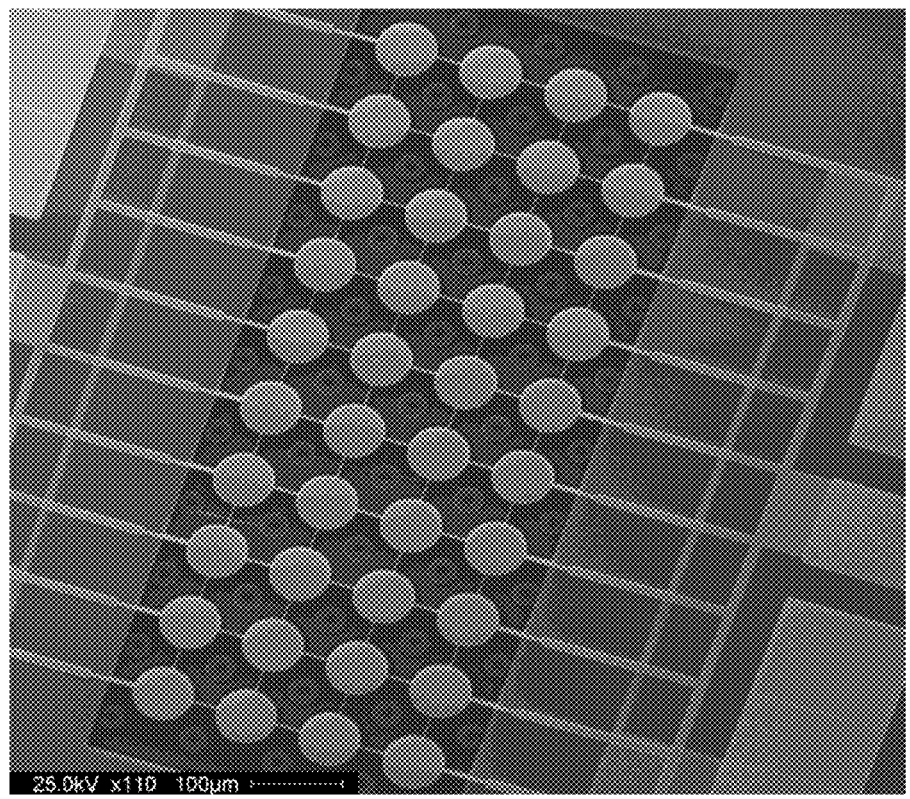
FIG. 17 is a SEM micrograph of a fabricated mechanically coupled filter with a 10×4 array of 30 μm radius disk resonators mechanically coupled together by $\lambda/4$ coupling and cross-coupling beams.

FIG. 17 shows the SEM micrograph of a mechanically coupled filter composed of a 10×4 array of 30 μm radius disk resonators. As can be observed, the fabrication of large two-dimensional arrays of mechanically coupled resonators is possible.

In some embodiments, the disclosed filters can be tunable. As described above, the geometry and material properties of a micromechanical resonator determine its characteristics, including operating frequency. Unfortunately, these characteristics typically cannot be altered after device fabrication. Although electrostatic force tuning is a known tuning mechanism, it typically requires complicated circuit routing and extra fabrication processes. In addition, the tuning can typically only be performed at frequencies lower than those needed for typical wireless RF front ends. Furthermore, the possible tuning range is quite limited.

When SOI wafers are used as described above, however, a tuning electrode can be incorporated underneath the resonating device (i.e., built-in SOI silicon device layer) to generate an electrostatic force. The electrostatic force can be used to pull the device downwards and generate stress on the resonator body that causes alternations in the device characteristics and, in particular, a significant frequency shift. This tuning structure can function very well under VHF and UHF frequency ranges without compromising the device yield or its manufacturing processes.

Figure 18:
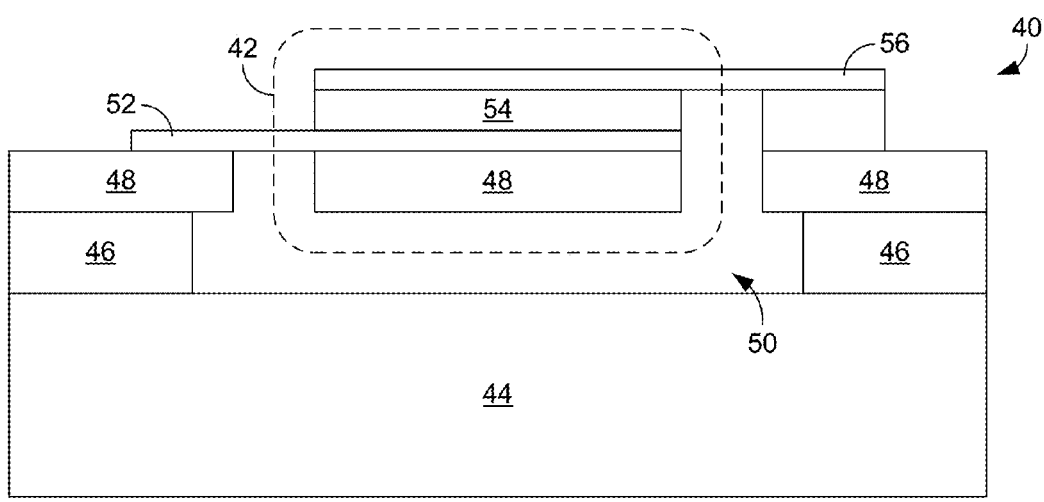
FIG. 18 is a schematic drawing of a piezoelectrically transduced micromechanical filter.

FIGS. 18 and 19 illustrate the above-described tuning Beginning with FIG. 18, shown is a piezoelectrically transduced micromechanical filter 40. As depicted in FIG. 18, the filter 40 has a structure similar to that of the filter 10 described above in relation to FIG. 2. Therefore, the filter 40 comprises a piezoelectric-on-substrate resonator 42 that is formed using an SOI wafer that comprises a substrate 44 (or handle layer), a buried oxide layer 46, and a device layer 48. As can be appreciated from FIG. 18, part of the buried oxide layer 46 has been removed to form an air gap 50 that enables suspension of the resonator 42. In addition to the device layer 48, the resonator 42 includes a bottom electrode 52, a piezoelectric layer 54, and a top electrode 56. Each of these components can have configurations similar to those described above in relation to FIG. 2.

Figure 19A:
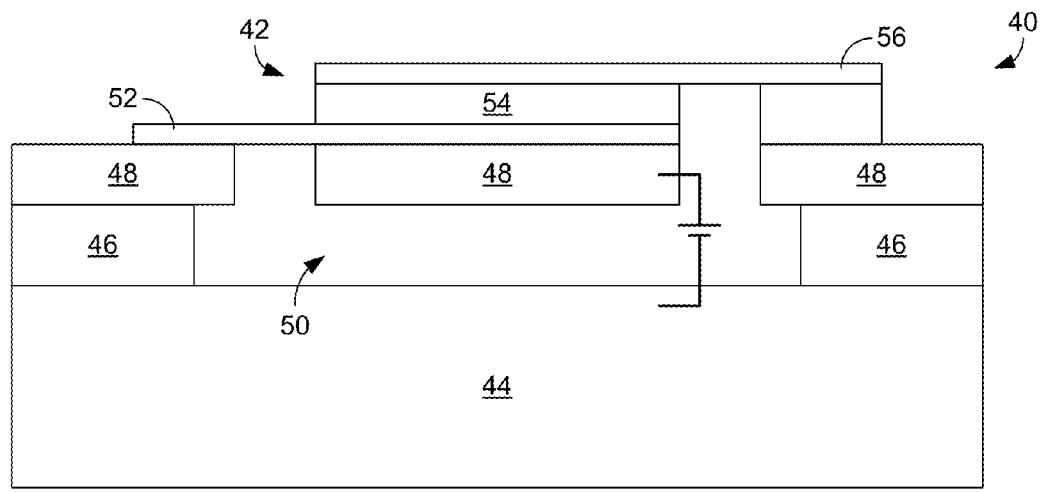
FIGS. 19A and 19B are schematic drawings of the filter of FIG. 18 showing its orientation before and after the application of a tuning voltage, respectively.
Figure 19B:
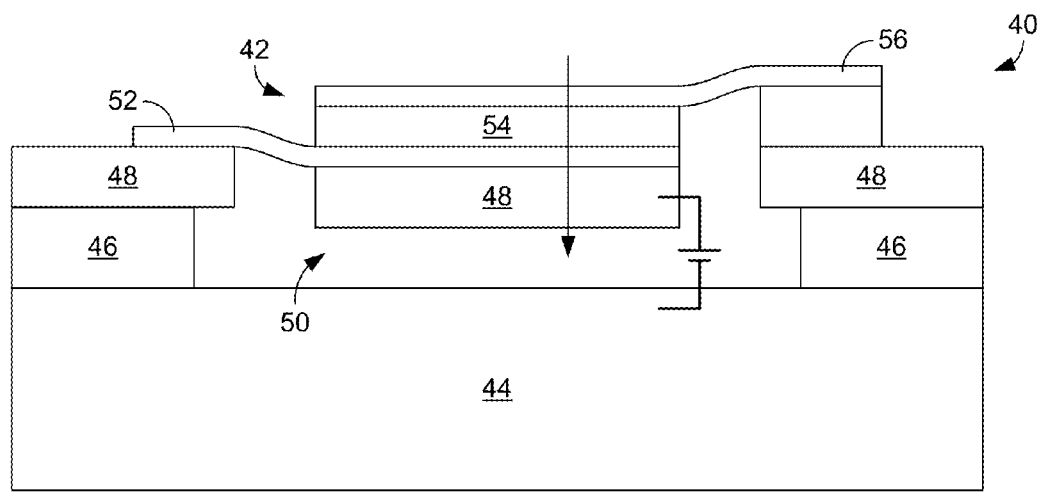

To tune the filter 40, a DC tuning voltage is applied between the device layer 48 and the handle layer 44 to induce an electrostatic force. When the DC voltage is applied, it pulls the resonator 42 downwards. Such functionality is illustrated in FIGS. 19A and 19B. In FIG. 19A, no tuning voltage has been applied to the device 40. The device 40 is therefore in an initial, natural state. Once a tuning voltage is applied, however, the resonator 42 is pulled downward as indicated by the arrow in FIG. 19B. By varying the voltage level, one can vary the effectiveness of the pulling force and the level of induced stress, thus altering the device's center frequency. The amount of voltage that is applied can depend upon the particulars of the device 40 and the degree of tuning desired. By way of example, however, the tuning voltage can be in the range of approximately 5 to 30 V. Essentially, it is the level of the electrical field (determined by the tuning voltage together with the thickness of the buried oxide layer) that determines the effectiveness of this tuning method through the means of modulating the stress in the resonator body. Once the tuning voltage is no longer applied, the resonator 42 returns to its initial state shown in FIG. 19A, making the tuning reversible. Notably, the above-described tuning method could be used to tune any resonator.

The invention claimed is:

1. A micromechanical filter comprising:
multiple subfilters, including a first subfilter comprising first and second piezoelectric resonators mechanically coupled in series by a narrow coupling beam and a second subfilter comprising first and second piezoelectric resonators mechanically coupled in series by a narrow coupling beam;
a first narrow cross-coupling beam mechanically coupling the first piezoelectric resonator of the first subfilter to the first piezoelectric resonator of the second subfilter; and
a second narrow cross-coupling beam mechanically coupling the second piezoelectric resonator of the first subfilter to the second piezoelectric resonator of the second subfilter;
wherein the cross-coupling beams mechanically couple the first and second subfilters in parallel.

2. The micromechanical filter of claim 1, wherein the piezoelectric resonators are disk resonators that operate in contour mode.

3. The micromechanical filter of claim 2, wherein each disk resonator has a radius of approximately 5 to 500 μm.

4. The micromechanical filter of claim 1, wherein the coupling beams each have a length of $\lambda/4$, wherein $\lambda$ is the resonance wavelength of the subfilter.

5. The micromechanical filter of claim 1, wherein the coupling beams each has have a length of $\lambda/2$, wherein $\lambda$ is the resonance wavelength of the subfilter.

6. The micromechanical filter of claim 1, wherein the first subfilter further includes a third piezoelectric resonator, the second and third piezoelectric resonators being mechanically connected by a further coupling beam.

7. The micromechanical filter of claim 6, wherein the first subfilter further includes a fourth piezoelectric resonator, the third and fourth piezoelectric resonators being mechanically connected by a further coupling beam.

8. The micromechanical filter of claim 1, wherein the cross-coupling beams each have a length of $\lambda/4$, wherein $\lambda$ is the resonance wavelength of the subfilters.

9. The micromechanical filter of claim 1, wherein the cross-coupling beams each have a length of $\lambda/2$, wherein $\lambda$ is the resonance wavelength of the subfilters.

10. The micromechanical filter of claim 1, wherein the piezoelectric resonators each comprise a bottom electrode, a top electrode, and a piezoelectric layer between the electrodes.

11. The micromechanical filter of claim 10, wherein the piezoelectric resonators are constructed as piezoelectric-on-substrate resonators.

12. The micromechanical filter of claim 11, wherein the filter is constructed on a silicon-on-insulator wafer comprising a handle layer, a buried oxide layer, and a device layer and wherein each resonator further comprises a portion of the device layer.

13. The micromechanical filter of claim 12, wherein portions of the buried oxide layer positioned below the piezoelectric resonators are removed so that there is an air gap between the resonators and the handle layer.

14. A micromechanical filter comprising:
a first subfilter comprising first and second piezoelectric resonators mechanically coupled in series by a coupling beam, the coupling beam having a length of $\lambda/4$, wherein $\lambda$ is the resonance wavelength of the subfilter;
a second subfilter comprising first and second piezoelectric resonators mechanically coupled in series by a coupling beam, the coupling beam having a length of $\lambda/4$;
a first cross-coupling beam mechanically coupling the first piezoelectric resonator of the first subfilter to the first piezoelectric resonator of the second subfilter; and
a second cross-coupling beam mechanically coupling the second piezoelectric resonator of the first subfilter to the second piezoelectric resonator of the second subfilter.

15. The micromechanical filter of claim 14, wherein the first and second cross-coupling beams have a length of $\lambda/4$.

16. The micromechanical filter of claim 14, wherein the first and second cross-coupling beams have a length of $\lambda/2$.

17. The micromechanical filter of claim 14, wherein each piezoelectric resonator is a piezoelectric-on-substrate resonator including a bottom electrode, a top electrode, a piezoelectric layer between the electrodes, and a substrate on which the bottom electrode is formed.

18. The micromechanical filter of claim 17, wherein the filter is constructed on a silicon-on-insulator wafer comprising a handle layer, a buried oxide layer, and a device layer, and wherein the device layer forms the substrate of each piezoelectric resonator.

19. The micromechanical filter of claim 18, wherein portions of the barrier oxide layer positioned below the piezoelectric resonators are removed so that there is an air gap between the resonators and the handle layer.

* * * * *

UNITED STATES PATENT AND TRADEMARK OFFICE
CERTIFICATE OF CORRECTION

| | |
|---|---|
| PATENT NO. | : 9,276,556 B1 |
| APPLICATION NO. | : 14/032871 |
| DATED | : March 1, 2016 |
| INVENTOR(S) | : Wu et al. |

It is certified that error appears in the above-identified patent and that said Letters Patent is hereby corrected as shown below:

In the Specification

Column 1, line 13, should read

Notice of Government-Sponsored Research

This invention was made with government support under Grant Number 0925929 awarded by The National Science Foundation. The government has certain rights in the invention.

Signed and Sealed this
Fifth Day of July, 2016

Michelle K. Lee
*Director of the United States Patent and Trademark Office*